(12) United States Patent
Isogai et al.

(10) Patent No.: US 6,585,245 B2
(45) Date of Patent: Jul. 1, 2003

(54) PRINTED-WIRING-BOARD-RELATING-OPERATION PERFORMING SYSTEM

(75) Inventors: Takeyoshi Isogai, Hekinan (JP); Hiroshi Katsumi, Chiryu (JP); Noriaki Iwaki, Hekinan (JP)

(73) Assignee: Fuji Machine Manufacturing Co., Ltd., Chiryu (JP)

( * ) Notice: Subject to any disclaimer, the term of this patent is extended or adjusted under 35 U.S.C. 154(b) by 9 days.

(21) Appl. No.: 09/915,536

(22) Filed: Jul. 27, 2001

(65) Prior Publication Data

US 2002/0021953 A1 Feb. 21, 2002

(30) Foreign Application Priority Data

Aug. 9, 2000  (JP) ........................................ 2000-241635

(51) Int. Cl.$^7$ ............................................. B25B 11/00
(52) U.S. Cl. ............................... 269/21; 29/744; 269/8; 269/903
(58) Field of Search ................................ 29/744, 281.1, 29/743; 269/414, 903, 21, 900, 289 R, 8

(56) References Cited

U.S. PATENT DOCUMENTS

| | | | |
|---|---|---|---|
| 4,283,847 A | * 8/1981 | May .............................. | 29/832 |
| 4,399,988 A | * 8/1983 | De Shong ..................... | 9/281.4 |
| 4,910,859 A | * 3/1990 | Holcomb | |
| 5,067,695 A | * 11/1991 | Huddleston .................. | 269/21 |
| 5,311,304 A | * 5/1994 | Monno ......................... | 348/87 |
| 5,794,329 A | 8/1998 | Rossmeisl et al. | |
| 5,909,706 A | * 6/1999 | Jin et al. ..................... | 101/126 |
| 6,029,966 A | * 2/2000 | Hertz et al. ................. | 269/266 |
| 6,438,822 B1 | * 8/2002 | Hattori ......................... | 29/739 |

FOREIGN PATENT DOCUMENTS

| | | |
|---|---|---|
| EP | 0 404 577 A1 | 12/1990 |
| JP | A 7-15189 | 1/1995 |
| JP | A 7-15191 | 1/1995 |
| JP | A 07074500 | 3/1995 |
| JP | B2 7-93520 | 10/1995 |
| JP | B2 2792931 | 6/1998 |
| JP | B2 2824378 | 9/1998 |

* cited by examiner

Primary Examiner—Carl S. Miller
(74) Attorney, Agent, or Firm—Oliff & Berridge, PLC

(57) ABSTRACT

A system for performing an operation relating to a printed wiring board, including a first supporting table having a planar first supporting surface, a portion of the first supporting table that defines the first supporting surface being formed of a ferromagnetic material; a plurality of supporting members each of which has a seat portion having a bottom surface which is seated on the first supporting surface, and a support surface opposite to the bottom surface, a portion of the seat portion being formed of a permanent magnet, each supporting member being attached, owing to a magnetic force of the permanent magnet, to the first supporting surface to support a back surface of the wiring board; an operation performing device which performs an operation for a front surface of the wiring board whose back surface is supported by the respective support surfaces of the supporting members; a second supporting table which is provided in a vicinity of the first supporting table and has a second supporting surface which is substantially continuous with the first supporting surface on a common plane, a portion of the second supporting table that defines the second supporting surface being formed of a ferromagnetic material; and a supporting-member moving device which moves each supporting member from the second supporting surface to the first supporting surface, and vice versa, by sliding the supporting member on the first and second supporting surfaces.

12 Claims, 19 Drawing Sheets

FIG. 10

| PIN NUMBER np | PIN-SETTING INFORMATION |
|---|---|
| 1 | $(X1, Y1)$ |
| 2 | $(X2, Y2)$ |
| 3 | $(X3, Y3)$ |
| ⋮ | ⋮ |
| np-1 | $(Xnp-1, Ynp-1)$ |
| np | $(Xnp, Ynp)$ |

PRINTED-WIRING-BOARD-RELATING-OPERATION PERFORMING SYSTEM

BACKGROUND OF THE INVENTION

1. Field of the Invention

The present invention relates to a system for performing an operation relating to a printed wiring board (PWB) and particularly to the art of supporting a PWB. A PWB with electric components (e.g., electronic components) being mounted thereon should be called as a printed circuit board (PCB) but, in the present specification, a PCB is also referred to as a PWB, for avoiding complexity.

2. Discussion of Related Art

Generally, a PWB includes a thin substrate formed of an electrically insulating material such as a synthetic resin, and a circuit pattern formed of an electrically conductive material on the thin substrate. Thus, the PWB has flexibility. Therefore, when electric components (ECs) are mounted on the PWB, or when an adhesive or a creamed solder is applied to the PWB before the mounting of ECs, the PWB cannot maintain an accurate planeness or flatness, unless a back surface of the PWB is supported at a considerably large number of points.

To solve this problem, Japanese Patent Document No. 7-15189 teaches using supporting pins to support a back surface of a PWB. More specifically described, this document discloses a PWB supporting device including a base plate and a plurality of supporting pins. Each of the supporting pins has, at one of lengthwise opposite ends thereof, a support surface to support a PWB, and the other end portion of the each pin is formed of a permanent magnet. Thus, each supporting pin can be fixed owing to a magnetic force to the base plate that is formed of a magnetic material.

The supporting pins support the back surface of the PWB. However, the supporting pins must not engage uneven portions of the PWB itself or the ECs already mounted on the back surface thereof. Therefore, the supporting pins must engage only limited portions of the back surface of the PWB. Generally, different sorts of PWB have different patterns of limited portions that can be engaged by the supporting pins. Therefore, when the current sort of PWBs for each of which an operation is to be performed are changed to a new sort of PWBs, the supporting pins are re-arranged on the base plate. In the case where the supporting pins are automatically re-arranged, a force that can overcome the magnetic force being exerted on each supporting pin is applied to the each pin in a direction away from the base plate, so as to detach the each pin from the base plate. Subsequently, supporting pins that are to support the new sort of PWBs are attached to the base plate.

When each supporting pin is detached from the base plate, the each pin, however, is not detached before the force applied to the each pin overcomes the magnetic force. Once the force applied to the each pin overcomes the magnetic force, the magnetic force abruptly decreases as the each pin is moved away from the base plate. Thus, an impact occurs to the base plate, so that the base plate is vibrated and an impact sound is produced. If a smaller magnetic force is exerted to the each pin, a smaller impact will occur. However, the smaller magnetic force may be too weak to fix the each pin to the base plate.

SUMMARY OF THE INVENTION

The present invention provides a PWB-relating-operation performing system that has each feature described below.

The following features are described, like claims, in respective paragraphs that are given respective sequential numbers. Any feature that includes another feature shall do so by referring to the number given to the latter feature. However, the following features and the appropriate combinations thereof are just examples to which the technical features, and the combinations thereof, described in the specification are by no means limited. In addition, in the case where one feature recites a plurality of items, it is not essentially required that all of those items be simultaneously employed in the one feature. That is, it is possible to select and employ only a portion (one, two, . . . , but not all) of those items.

(1) According to a first feature of the present invention, there is provided a system for performing an operation relating a printed wiring board, comprising a first supporting table which has a planar first supporting surface, at least a portion of the first supporting table that defines the first supporting surface being formed of a ferromagnetic material; a plurality of supporting members each of which has a seat portion having a bottom surface which is seated on the first supporting surface, and a support surface which is opposite to the bottom surface, at least a portion of the seat portion being formed of a permanent magnet, the each supporting member being attached, owing to a magnetic force of the permanent magnet, to the first supporting surface to support a back surface of the printed wiring board; an operation performing device which performs an operation for a front surface of the printed wiring board whose back surface is supported by the respective support surfaces of the supporting members; a second supporting table which is provided in a vicinity of the first supporting table and has a second supporting surface which is substantially continuous with the first supporting surface on a common plane, at least a portion of the second supporting table that defines the second supporting surface being formed of a ferromagnetic material; and a supporting-member moving device which moves the each supporting member from the second supporting surface to the first supporting surface, and from the first supporting surface to the second supporting surface, by sliding the each supporting member on the first and second supporting surfaces.

Each of the supporting members may be either a holding member, recited in the fifth feature (5), that supports the printed wiring board (PWB) while applying negative pressure to the board and thereby holding the same, or a simple member which just supports the PWB and does not have the holding function.

The operation performing device may be an electric-component mounting device which mounts electric components (ECs) on a front surface of PWB; a screen printing machine which screen-prints creamed solder on a front surface of a PWB; a highly-viscous-fluid applying device which sequentially applies a highly viscous fluid, such as adhesive, to a single spot, or plural spots, on a front surface of each of PWBs; or an electric-circuit inspecting device which inspects an electric circuit formed on a front surface of a PWB.

The first and second supporting surfaces may be always kept substantially continuous with each other on the common plane, or may be temporarily made substantially continuous with each other on the common plane. In the former case, the first and second supporting surfaces may be provided by a single continuous planar surface, or two planar surfaces which are independent of each other and are contiguous with each other without a gap or a step therebetween or adjacent to each other with a small gap or step therebetween. The phrase "substantially continuous" used in this feature means that the first and second supporting surfaces do not have a gap or step therebetween, or have such gap and/or step which allow each supporting member to slide and move between the two supporting surfaces. More specifically described, the first and second supporting surfaces may have a step having such a dimension which assures that, owing to a roundness or a chamfer which is present at an edge of the bottom surface or the support surface of each supporting member and has the function of guiding the each supporting member, the each supporting member can be moved over the step; and/or a gap having such a dimension which is sufficiently smaller than that of the bottom surface of each supporting member and assures that in a state in which one of the first and second supporting surfaces is stably supporting the bottom surface of the each supporting member, the other supporting surface starts supporting a portion of the bottom surface. In the case where the first and second supporting surfaces are temporarily made substantially continuous with each other, at least one of the first and second supporting surfaces is moved relative to the other supporting surface in at least one of a direction parallel to, and a direction perpendicular to, the supporting surfaces. When each supporting member is moved between the first and second supporting surfaces, those supporting surfaces are made substantially continuous with each other on the common plane.

The common plane on which the first and second supporting surfaces are substantially continuous with each other may be either a horizontal plane or a plane inclined relative to the horizontal plane. In the case where the first and second supporting surfaces are temporarily made substantially continuous with each other, it is not essentially required, in a state in which the two supporting surfaces are not continuous with each other, that the two supporting surfaces are parallel to each other.

One of the first and second supporting tables may be provided by a PWB supporting device which supports the PWB for which the operation is performed; and the other supporting table may be provided by a supporting-member storing device in which the supporting members attachable to the first supporting table are stored. The first and second supporting tables may be alternately provided by the PWB supporting device and the supporting-member storing device. For example, the PWB-relating-operation performing system may comprise an EC mounting system which mounts ECs on a PWB, the operation performing device may comprise an EC mounting device which takes ECs from an EC supplying device and mounts the ECs on the PWB supported by the PWB supporting device, and the EC supplying device may comprise a table and a plurality of feeders placed on the table such that respective EC-supply portions of the feeders are arranged in a direction parallel to the PWB-convey direction. In this case, it is possible to employ two PWB supporting devices for a first mounting area and a second mounting area, respectively, which correspond to a first group of feeders, and a second group of feeders, of the EC supplying device, divided from each other at the middle position as seen in the above-direction direction. The EC mounting device mounts ECs, alternately on respective PWBs supported by the two PWB supporting devices. In this case, one of the two PWB supporting devices that currently supports the PWB on which ECs are not being mounted by the EC mounting device, functions as the supporting-member storing device. The table of the EC supplying device can support a sufficiently large number of sorts of feeders that assure that the EC mounting device can mount ECs on a plurality of sorts of PWBs. More specifically described, a first portion of the table that corresponds to the first mounting area supports such feeders that feed ECs to only such sorts of PWBs conveyed to the first mounting area only, and such feeders that frequently feed ECs to those sorts of PWBs; and the second half portion of the table that corresponds to the second mounting area supports such feeders that feed ECs to only such sorts of PWBs conveyed to the second mounting area only, and such feeders that frequently feed ECs to the latter sorts of PWBs. Therefore, each of the feeders is near to a PWB supported by a corresponding one of the PWB supporting devices, and the EC mounting head has only to move short distances to mount ECs on each PWB. This leads to improving the efficiency of mounting of ECs. However, it is possible to employ feeders which feed ECs to both respective PWBs supported by the PWB supporting devices in the first and second mounting areas. In this case, those feeders are placed on a middle portion of the table as seen in the above-indicated direction.

Each of the supporting members is attached, owing to a magnetic force, to each of the first and second supporting tables. The bottom surface of each supporting member and the first and second supporting surfaces are all planar or flat surfaces. Therefore, when the supporting-member moving device applies a force to each supporting member in a direction parallel to the first and second supporting surfaces, each supporting member is moved relative to the supporting surfaces, i.e., slid on the same. At this time, each supporting member receives a force equal to the product of the magnetic force and a friction coefficient with respect to the bottom surface of each supporting member and the first or second supporting member, in a direction to resist the movement of each supporting member. When this resistance force is overcome by the force applied by the supporting-member moving device to each supporting member, the each supporting member starts moving. This resistance force is small, and each supporting member can be moved with a smaller force than a force which is applied to the each supporting member in a direction parallel to the axis line thereof and away from the first or second supporting surface in order that the each supporting member may be detached from the supporting surface. Since a kinetic friction coefficient is smaller than a static friction coefficient, some impact is produced when each supporting member starts moving. However, this impact is smaller than that produced when each supporting member is detached from the first or second supporting surface. Therefore, a great magnetic force may be employed to sufficiently strongly attach each supporting member to the first or second supporting table, on one hand, and a small force may be applied by the supporting-member moving device to the each supporting member to move the same, on the other hand. In addition, only small vibration or noise is produced by the first and second supporting tables and the supporting-member moving device.

(2) According to a second feature of the present invention that includes the first feature (1), the operation performing system further comprises a printed-wiring-board conveying device which carries in the printed wiring board to a position aligned with the first supporting table, and carries out the printed wiring board from the position.

At the position aligned with the first supporting table, the operation is performed for the front surface of the PWB whose back surface is supported by the supporting members attached to the first supporting table.

(3) According to a third feature of the present invention that includes the second feature (2), the printed-wiring-board conveying device comprises two guide rails whose distance is changeable; a printed-wiring-board moving device which moves the printed wiring board along the guide rails; and a width changing device which changes the distance of the two guide rails and thereby changes a width of conveying of the printed wiring board.

When the distance of the two guide rails is changed, both of the two guide rails may be moved relative to each other, or one of the two guide rails may be moved relative to the other guide rail.

Each supporting member can be moved by a force which is applied thereto in a direction perpendicular to the axis line thereof. Therefore, if at least one of the guide rails is moved and may collide with the supporting members attached to the first supporting surface of the first supporting table, the supporting members falls to the first supporting surface, allowing the guide rail or rails to be moved. Thus, the supporting members and the rails are prevented from being damaged.

(4) According to a fourth feature of the present invention that includes the third feature (3), the second supporting table is provided at a position aligned with a space remaining between the two guide rails when the distance of the two guide rails is shortest, and the second supporting surface has a width not longer than the shortest distance.

According to this feature, the guide rails do not interfere with the supporting members attached to the second supporting table, even if one or both of the guide rails may be moved. Therefore, the second supporting table can function as a storing device in which the supporting members detached from the first supporting table are stored. Since the guide rails cannot interfere with the supporting members attached to the second supporting table, it is not needed to employ any measures to prevent each supporting member from being damaged if the each supporting member would be interfered with by the guide rails and fall down to the second supporting surface. Therefore, on the second supporting table, the supporting members may be arranged at a short pitch, i.e., at a high rate.

(5) According to a fifth feature of the present invention that includes any one of the first to fourth features (1) to (4), the first holding table comprises a holding table having a holding surface as the first supporting surface, and a plurality of negative-pressure-supply holes opening in the holding surface, and the supporting members comprise a plurality of holding members each of which has a negative-pressure passage formed therethrough, and is set on the holding surface of the holding table such that the negative-pressure passage thereof is communicated with at least one of the negative-pressure-supply holes, so that the support surface of the each holding member supports the back surface of the printed wiring board and a negative pressure supplied via the negative-pressure passage from the at least one negative-pressure-supply hole is applied to the back surface of the board to hold the board.

Since the holding members apply negative pressure to the PWB and thereby attract the same to the respective support surfaces thereof, the PWB is corrected to be plane even if it may have an upwardly convex warpage.

The holding members can be engaged with only limited areas of the back surface of the PWB. Therefore, the holding members are not attached to all of the negative-pressure-supply holes. Thus, it is needed to prevent the leakage of negative pressure from the negative-pressure-supply holes to which the holding members are not connected. The leakage of negative pressure may be prevented by, e.g., closing, with the closing members recited in the sixth feature (6) described below, the negative-pressure-supply holes, or alternatively, as will be described in DETAILED DESCRIPTION OF PREFERRED EMBODIMENTS, providing the negative-pressure-supply holes with respective opening and closing valves which are opened when the holding members are connected to the corresponding supply holes to communicate the respective negative-pressure passages of the holding members with the corresponding supply holes but remain closed in a state in which the holding members are not connected to the supply holes.

(6) According to a sixth feature of the present invention that includes the fifth feature (5), the operation performing system further comprises a plurality of closing members each of which has a bottom surface which is seated on the holding surface of the holding table, at least a portion of the each closing member that is located in a vicinity of the bottom surface being formed of a permanent magnet, the each closing member being attached, owing to a magnetic force of the permanent magnet, to the holding surface to close one of the negative-pressure-supply holes that is not communicated with the negative-pressure passages of any holding members; a third supporting table which is provided in a vicinity of the holding table and has a third supporting surface which is substantially continuous with the holding surface on the common plane, at least a portion of the third supporting table that defines the third supporting surface being formed of a ferromagnetic material; and a closing-member moving device which moves the each closing member from the third supporting surface to the holding surface and from the holding surface to the third supporting surface, by sliding the each closing member on the third supporting surface and the holding surface.

The above description of the relationship between the first and second supporting surfaces applies to that between the first supporting surface as the holding surface, and the third supporting surface.

Like each supporting member, each closing member can be moved or slid on the third supporting surface and the holding surface, by a force applied thereto in a direction parallel to those surfaces. Therefore, the closing-member moving device can move, with a small force, each closing member which is attracted, by a great magnetic force, to the third supporting table or the holding table. When each closing member is moved, only small vibration, impact, and noise are produced.

(7) According to a seventh feature of the present invention that includes the sixth feature (6), the third supporting table is provided by the second supporting table, and the closing members are supported on the second supporting surface.

(8) According to an eighth feature of the present invention that includes the sixth or seventh feature (6) or (7), the closing-member moving device is provided by the supporting-member moving device.

(9) According to a ninth feature of the present invention that includes any one of the first to eighth features (1) to (8), the operation performing device comprises an operation performing head, and the supporting-member moving device moves the operation performing head in a direction parallel to the first supporting surface.

When the operation performing head performs the operation, the supporting-member moving device moves the operation performing head relative to the PWB. Thus, the present operation performing system can enjoy a simple construction.

(10) According to a tenth feature of the present invention that includes any one of the first to ninth features (1) to (9), the supporting-member moving device comprises at least one engageable portion which is engageable with a portion of the each supporting member that is near to the bottom surface thereof.

(11) According to an eleventh feature of the present invention that includes any one of the first to tenth features (1) to (10), the supporting-member moving device comprises a pair of grasping members which are engageable with the each supporting member.

(12) According to a twelfth feature of the present invention that includes any one of the first to eleventh features (1) to (11), the supporting-member moving device comprises a holding device which holds the each supporting member; and a rotating device which rotates said each supporting member held by the holding device.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which:

FIG. 10 is a view for explaining pin-setting information used to set supporting pins;

DETAILED DESCRIPTION OF PREFERRED EMBODIMENTS

Hereinafter, there will be described in detail an embodiment of the present invention as applied to an electric-component (EC) mounting system, by reference to the drawings.

Figure 1:
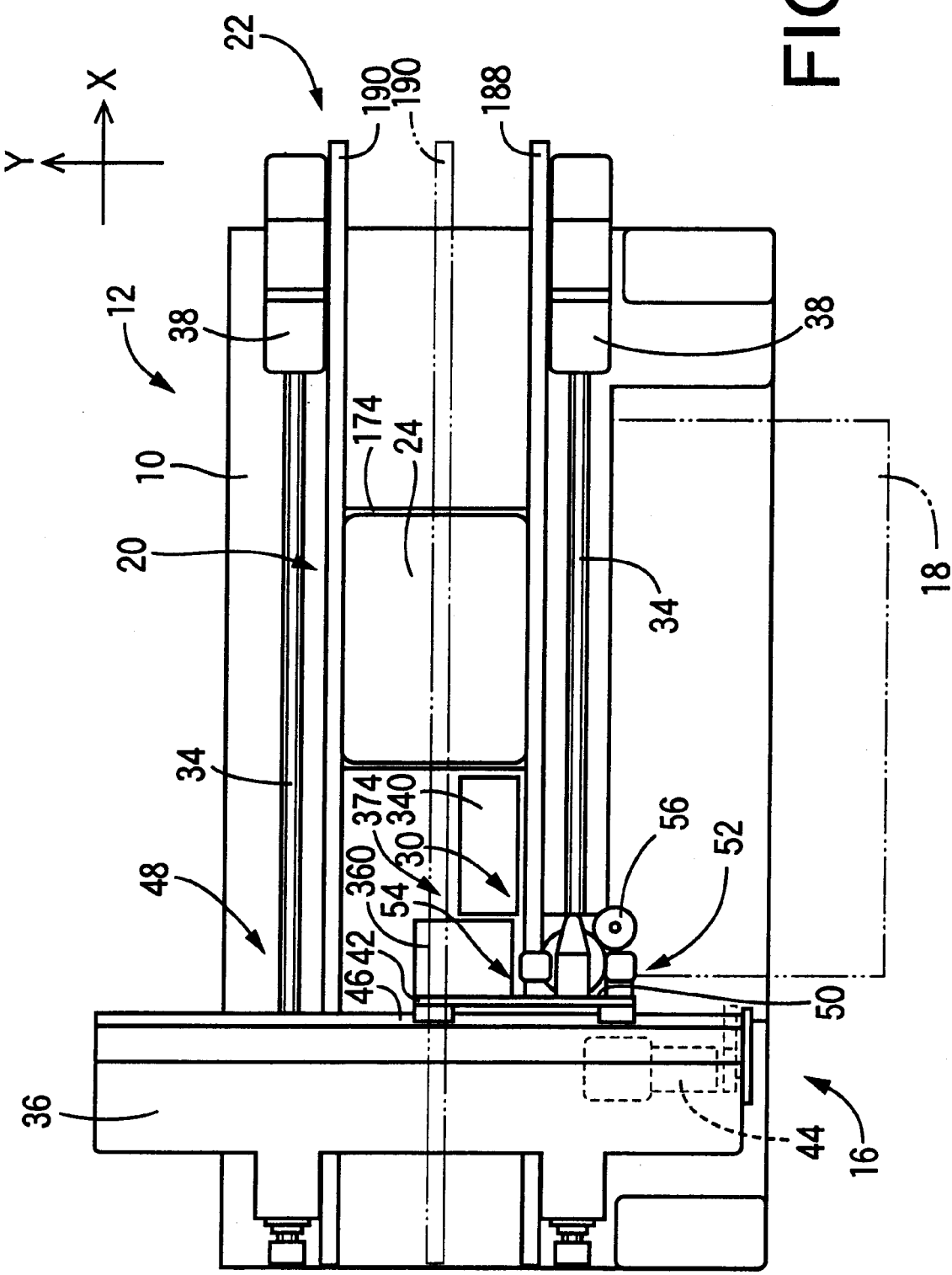
FIG. 1 is a schematic plan view of an electric-component (EC) mounting system to which the present invention is applied.

In FIG. 1, reference numeral 10 designates a base as a main frame of an EC mounting system 12 as a PWB-relating-operation performing system. On the base 10, there are provided an EC mounting device 16 as an operation performing device, an EC supplying device 18, and a PWB supporting and conveying device 20. The PWB supporting and conveying device 20 includes a PWB conveyor 22 which extends in an X-axis direction (i.e., a left-right direction in FIG. 1) and which conveys a PWB 24 in the X-axis direction, and positions and supports the PWB 24 at a prescribed EC-mount position where the PWB 24 is stopped by a stopper as a stopping device, not shown. The PWB supporting and conveying device 20 will be described in more detail later. The EC supplying device 18 is provided on one side of the PWB conveyor 22. Since, however, the EC supplying device 18 is not relevant to the present invention, no description thereof is made here.

The EC mounting device 16 has a construction similar to an EC mounting device disclosed in Japanese Patent No. 2,824,378, and accordingly it is briefly described here.

The EC mounting device 16 includes an EC mounting head 30 as an operation performing head that is linearly movable in each of the X-axis direction and a Y-axis direction perpendicular to the X-axis direction to convey an EC 32, in particular, an electronic component, and mount the same. To this end, on the base 10, there are provided, on both sides of the PWB conveyor 22 in the Y-axis direction, two ball screws 34 which extend parallel to the X-axis direction and which are threadedly engaged with two nuts, not shown, fixed to an X-axis table 36. When the ball screws 34 are rotated by respective X-axis-table drive motors 38, the X-axis table 36 is moved in the X-axis direction. On the bed 10, there are provided two guide rails as guide members, not shown, below the two ball screws 34, and the movement of the X-axis table 36 is guided by the two guide rails and two guide blocks as guided members, not shown, fixed to the table 36 such that the two guide blocks slide on the two guide rails, respectively.

The X-axis table 36 supports a ball screw 40 (FIG. 2) which extends parallel to the Y-axis direction and which is threadedly engaged with a nut, not show, fixed to a Y-axis table 42. When the ball screw 40 is rotated by a Y-axis-table drive motor 44 (FIG. 1), the Y-axis table 42 is moved while being guided by two guide rails 46 as guide members. Thus, the nuts, the ball screws 34, the X-axis table 36, and the X-axis-table drive motors 38, and, the nut, the ball screw 40, the Y-axis table 42, and the Y-axis-table drive motor 44 cooperate with each another to provide an X-Y robot 48 which moves the EC mounting head 30 in directions parallel to a front surface 28 of the PWB 24. The PWB 24 is horizontally conveyed, positioned, and supported, and the EC mounting head 30 is moved by the X-Y robot 48 to an arbitrary position on a horizontal plane.

Figure 2:
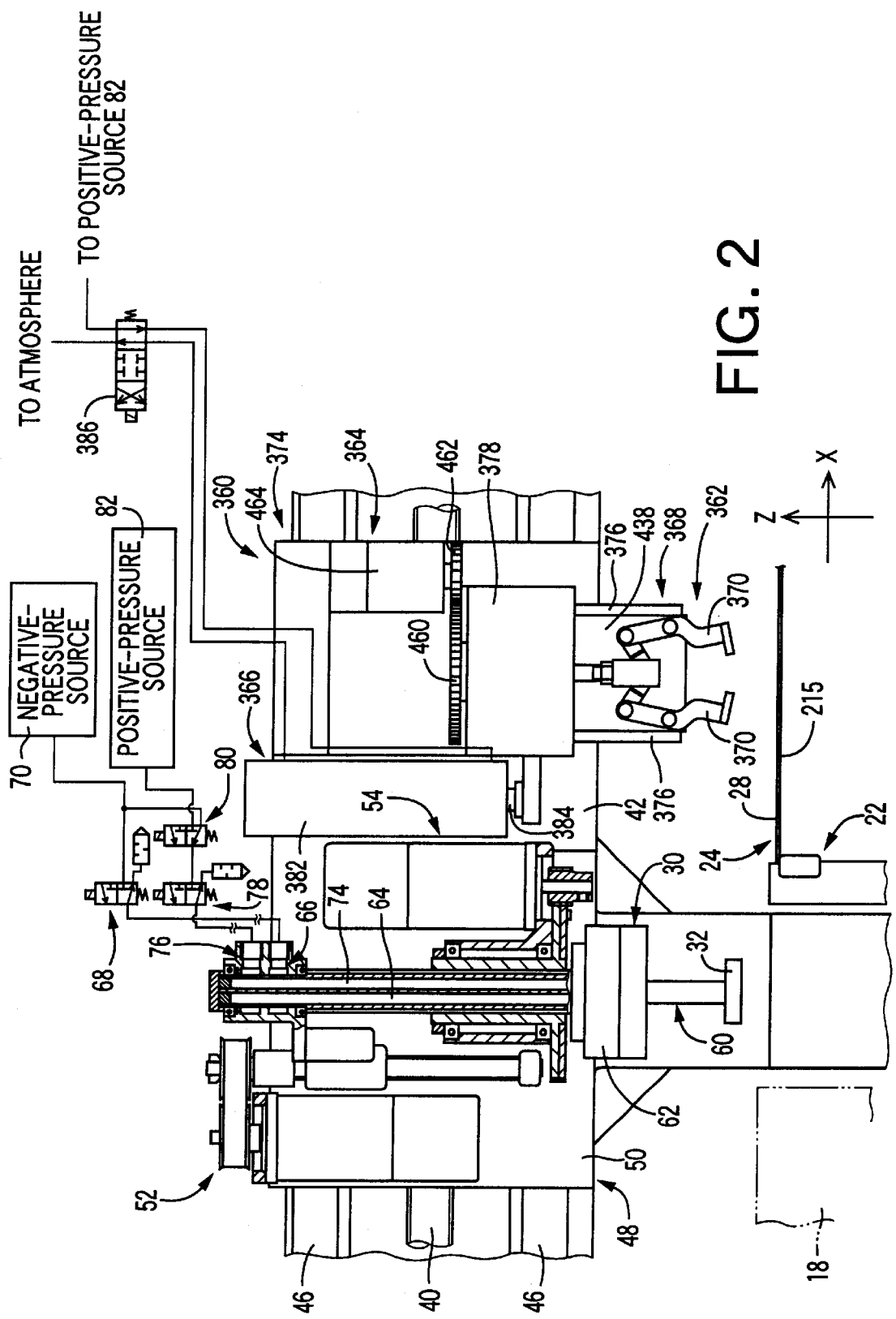
FIG. 2 is a side elevation view of an EC mounting device of the EC mounting system that includes a suction nozzle, a pin holder, and a Y-axis table supporting the suction nozzle and the pin holder.

On the X-axis table 36, there is provided a CCD (charge-coupled device) camera as an image taking device, below the Y-axis table 42, at a position between the EC supplying device 18 and the PWB supporting and conveying device 20 in the Y-axis direction. The CCD camera takes an image of the EC 32 held by the EC mounting head 30. Since, however, this CCD camera is not relevant to the present invention, no description thereof is made here. As shown in FIG. 2, the EC mounting head 30 is attached to a vertical side surface 50 of the Y-axis table 42, such that the head 30 is movable upward and downward and is rotatable. The side surface 50 supports an elevating and lowering device 52 which elevates and lowers the head 30; a rotating device 54 which rotates the head 30 about its centerline; and a CCD camera 56 (FIG. 1) as an image taking device that takes an image of each of a plurality of fiducial marks provided on the PWB 24. The CCD camera 56 is not shown in FIG. 2. In the present embodiment, the Y-axis table 42 supports a lighting device, not shown, which lights an object when the CCD camera 56 takes an image of the object. The elevating and lowering device 52 moves the EC mounting head 30 in directions perpendicular to the front surface 28 of the PWB 24, and cooperates with the X-Y robot 48 to provide an operation-relating moving device which moves the EC mounting head 30 relative to the PWB 24 in not only the directions perpendicular to the front surface 28 of the PWB 24 but also directions parallel to the front surface 28.

As shown in FIG. 2, the EC mounting head 30 includes a suction nozzle 60 as a sort of component holder that sucks and holds the EC 32, and a nozzle holder 62 which holds the suction nozzle 60 such that the nozzle 60 is detachable from the holder 62. The nozzle holder 62 is moved by the X-Y table 48 to an arbitrary position on the horizontal plane. In the present embodiment, the nozzle holder 62 applies a suction or a negative pressure to the suction nozzle 60 and thereby holds the nozzle 60. To this end, the nozzle holder 62 is connected to a negative-pressure supply source 70 and the atmosphere via an air passage 64, a rotary valve 66, and a solenoid-operated direction-switch valve 68 and, when the direction-switch valve 68 is switched, the holder 62 is selectively communicated with the supply source 70 or the atmosphere, so that the holder 62 holds or releases the nozzle 60. In addition, the suction nozzle 60 is connected to the negative-pressure supply source 70, a positive-pressure supply source 82, and the atmosphere via an air passage 74, a rotary valve 76, and two solenoid-operated direction-switch valves 78, 80 and, when the direction-switch valves 68 are switched, the nozzle 60 is selectively communicated with the negative-pressure supply source 70, the positive-pressure supply source 82, or the atmosphere. The suction nozzle 62 applies a negative air pressure to the EC 32 and thereby holds it, and applies a positive air pressure to the EC 32 and thereby releases it. The negative-pressure supply source 70 may be a negative-pressure supplying device or an air sucking device, and the positive-pressure supply source 82 may be an air supplying device which supplies an air having a positive pressure. In the present embodiment, the direction-switch valves 68, 78, 80 are provided on the Y-axis table 42, and are connected to the negative-pressure supply source 70 and the positive-pressure supply source 82 via respective connectors, not shown, provided on the Y-axis table 42.

Figure 3:
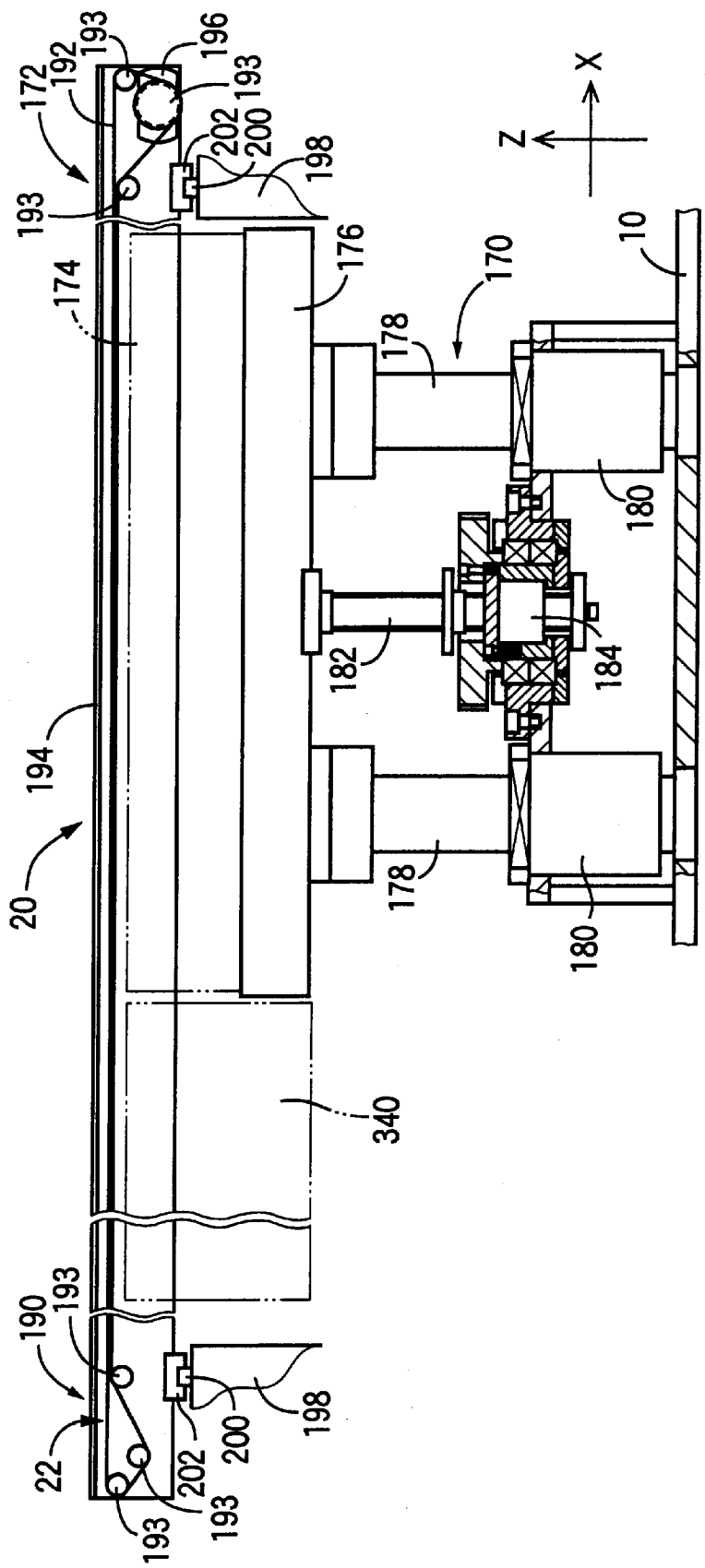
FIG. 3 is a partly cross-sectioned, front elevation view of a PWB supporting and conveying device of the EC mounting system that includes a PWB supporting device.

As shown in FIG. 3, the PWB supporting and conveying device 20 includes a PWB elevating and lowering device 170, a PWB clamping device 172, and a PWB supporting device 174. The PWB elevating and lowering device 170 is provided at a position aligned with an intermediate portion of the PWB conveyor 22, and includes a PWB lifter 176. Two guide rods 178 extend downward from a lower surface of the PWB lifter 176, and fit in two guide sleeves 180, respectively, fixed to the base 10, such that the lifter 176 is movable upward and downward. A ball screw 182 is fixed to the lower surface of the lifter 176, and is threadedly engaged with a nut 184 which is attached to the base 10 such that the nut 184 is rotatable about a vertical axis line and is not movable in an axial direction thereof. When the nut 184 is rotated by an elevating and lowering motor 186 (FIG. 9), the ball screw 182 is moved upward and downward, so that the PWB lifter 176 is moved upward and downward.

As shown in FIG. 1, the PWB clamping device 172 includes a fixed rail 188 and a movable rail 190 as guide rails that extend parallel to a PWB-convey direction (i.e., the X-axis direction). The fixed and movable rails 188, 190 have a plate-like configuration, and two conveyor belts 192 of the PWB conveyor 22 are supported by respective surfaces of the fixed and movable rails 188, 190 that are opposed to each other, and cooperate with each other to convey the PWB 24. In the present embodiment, the PWB conveyor 22 includes two endless belts 192 each as a conveying member or a wound-on member that are associated with the fixed and movable rails 188, 190, respectively, but only the belt 192 for the movable rail 190 is shown in FIG. 3. The conveyor 22 additionally includes two groups of pulleys 193 each as a rotary member that are associated with the fixed and movable rails 188, 190, respectively, but only the pulleys 193 for the movable rail 190 are shown in FIG. 3. The two groups of pulleys 193 include respective drive pulleys 193 which are connected to a common conveying motor 196 (FIG. 9) which is provided on the side of the fixed rail 188. When the motor 196 is operated, the two drive pulleys 193 are simultaneously rotated, so that the two belts 192 are circulated at a same speed. Thus, the PWB 24 supported on respective upper half portions of the two belts 192 is conveyed. The fixed and movable rails 188, 190 cooperate with each other to limit the movement of the PWB 24 in directions intersecting the PWB-convey direction and guide the movement of the PWB 24.

As shown in FIG. 3, an upper end portion of the movable guide 190 provides a PWB hold-down portion 194 which somewhat projects inward toward another PWB hold-down portion 194 which is provided by an upper end portion of the fixed rail 188. Those PWB hold-down portions 194 are slightly spaced from the front surface 28 of the PWB 24 as an upper surface thereof, in a state in which the PWB 24 is placed on the conveyor belts 192 of the PWB conveyor 22.

The opposed surfaces of the fixed and movable rails 188, 190 support respective clamping plates each as a movable clamping member that cooperate with the PWB hold-down portions 194 to clamp the PWB 24. The two clamping plates have an elongate shape parallel to a lengthwise direction of the fixed and movable rails 188, 190, and are normally biased by respective springs as biasing devices such that the clamping plates are held at an unclamping position where the clamping plates are spaced from the PWB hold-down portions 194 and are positioned below the conveyor belts 192. When the PWB 24 is clamped, a plurality of clamping cylinders each as a drive device move the clamping plates toward the PWB hold-down portions 194 so that the clamping plates cooperate with the hold-down portions 194 to clamp opposite end portions of the PWB 24. In the present embodiment, the PWB hold-down portions 194, the clamping plates, the springs, and the clamping cylinders cooperate with one another to provide the PWB clamping device 172.

The base 10 supports the movable rail 190 such that the movable rail 190 is movable in opposite directions perpendicular to the PWB-convey direction, i.e., in the Y-axis direction. As shown in FIG. 3, two guide rails 200 each as a guide member that extend in a direction perpendicular to the PWB-convey direction on the horizontal plane are provided on respective upper-end surfaces of two support blocks 198 fixed to the base 10. Two guide blocks 202 each as a guided member that are fixed to a lower surface of the movable rail 190 fit on the two guide rails 200, such that the movable rail 190 is movable on the rails 200. The movable rail 190 is moved by a moving device including a feed screw and a nut, each not shown, and a PWB-convey-width changing motor 204 (FIG. 9) as a drive source, so that when the feed screw is rotated by the motor 204, the movable rail 190 is moved toward, and away from, the fixed rail 188 and a PWB-convey width corresponding to a width of the PWB 24 conveyed by the PWB conveyor 22 is automatically changed. The moving device and the guide rails 200 cooperate with each other to provide a PWB-convey-width changing device; and the PWB conveyor 22 provides a PWB moving device, which cooperates with the fixed and movable rails 188, 190 to provide a PWB conveying device which carries in the PWB 24 to a position aligned with the PWB supporting device 174 and carries out the PWB 24 from that position.

Figure 4:
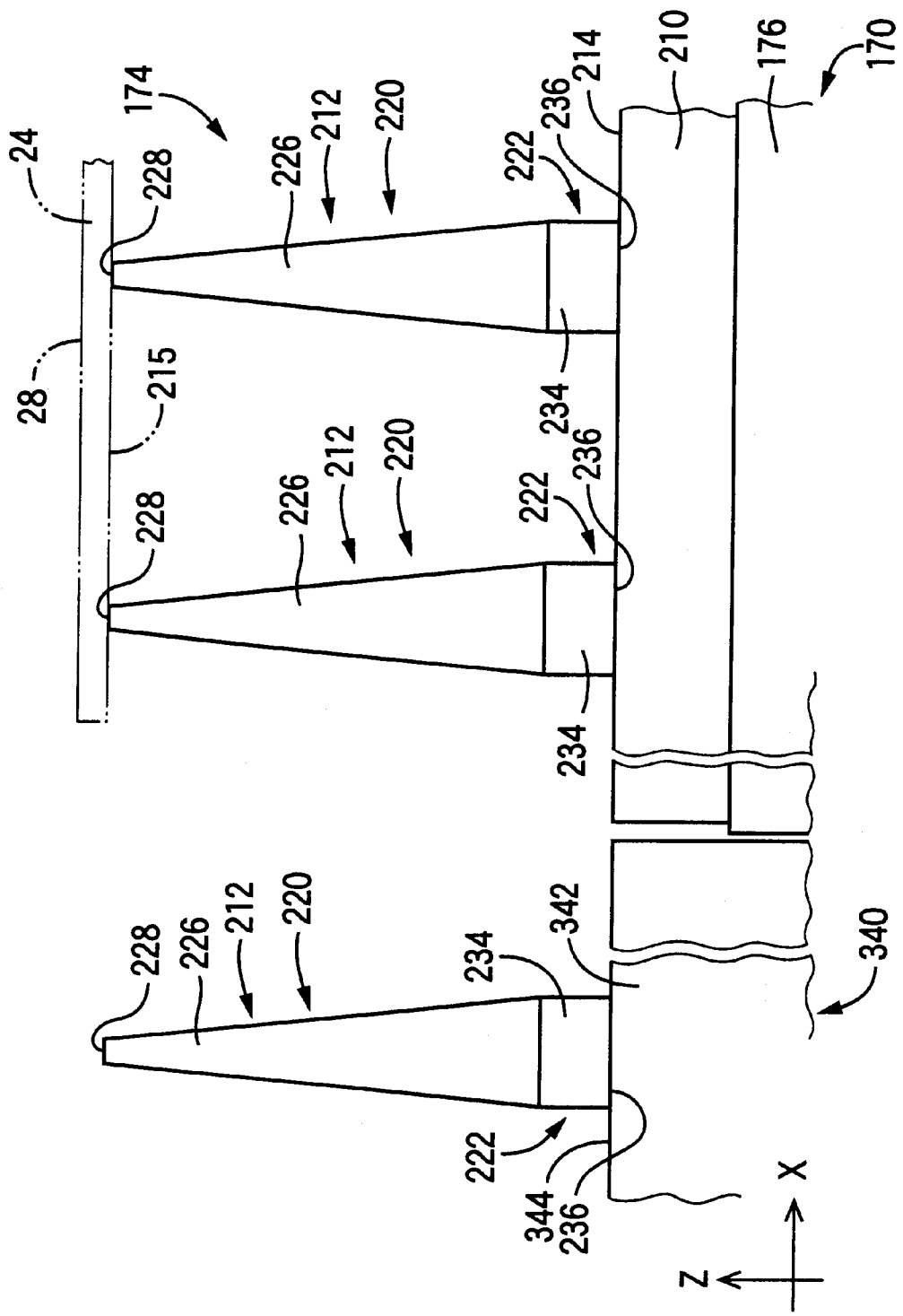
FIG. 4 is a front elevation view of respective portions of the PWB supporting device and a pin storing device that are adjacent to each other.

The PWB supporting device 174 is provided on the PWB lifter 176. As shown in FIG. 4, the PWB supporting device 174 includes a supporting table 210, and a plurality of supporting pins 212 each as a sort of supporting member that are attachable to the supporting table 210, and support a back surface 215 (FIG. 2) of the PWB 24. In the present embodiment, the supporting table 210 is formed of steel as a ferromagnetic material, and accordingly a supporting surface 214 as an upper surface of the supporting table 210 is formed of the ferromagnetic material to be plane or flat. In the present embodiment, the supporting table 210 has such a size which assures that the table 210 can support a plurality of sorts of PWBs having different sizes. The supporting table 210 has a high degree of planeness or flatness. Accordingly, the supporting surface 214 of the supporting table 210 enjoys a high degree of flatness. In the present embodiment, a surface of the PWB lifter 176 to which the PWB supporting device 174 is attached is horizontal, and the supporting table 210 is detachably attached to the PWB lifter 176 such that the supporting surface 214 of the supporting table 210 is horizontal. The PWB supporting device 174 is elevated and lowered by the PWB elevating and lowering device 170, so that at an upward-movement-end position of the device 174, the device 174 supports the PWB 24 and, at a downward-movement-end position of the device 174, the supporting pins 212 are rearranged or reset on the device 174.

Each of the supporting pins 212 includes a pin portion 220 and a seat portion 222. A pin 226 functioning as the pin portion 220 of the supporting pin 212 has a circular cross section, and is tapered such that its diameter decreases toward its free end (i.e., its upper end). A free or upper end surface of the pin 226 provides a PWB-support surface 228 (hereinafter, referred to as the support surface 228). In a state in which the supporting pin 212 is set on the supporting table 210, the support surface 228 is horizontal. A permanent magnet 234 is fixed to the other end surface of the pin 226 that is opposite to the support surface 228 and has the largest diameter, and provides the seat portion 222. The permanent magnet 234 has a cylindrical shape, and has a bottom surface 236 which is opposite to the support surface 228 and is seated on the supporting surface 214 of the supporting table 210.

As shown in FIG. 1, a pin-storing device 340 (hereinafter, referred to as the storing device 340) is provided adjacent to the supporting table 210. The storing device 340 stores a plurality of supporting pins 212. As shown in FIG. 4, the storing device 340 includes a supporting table 342. In the present embodiment, the supporting table 342 is formed of steel as a ferromagnetic material, and has a supporting surface 344 as an upper surface thereof that is formed of the ferromagnetic material to be flat or plane. Hereinafter, the supporting table 210 and the supporting surface 214 of the PWB supporting device 174 will be referred to as the first supporting table 210 and the first supporting surface 214, and the supporting table 342 and the supporting surface 344 of the storing device 340 will be referred to as the second supporting table 342 and the second supporting surface 344.

As indicated at two-dot chain line in FIG. 1, the second supporting table 342 of the storing device 340 is provided at a position aligned with a space which remains between the fixed and movable rails 188, 190 in a state in which the movable rail 190 is the nearest to the fixed rail 188 and the PWB conveyor 22 has the smallest PWB-convey width. The second supporting surface 344 has a width somewhat smaller than the smallest distance of the fixed and movable rails 188, 190 corresponding to the smallest PWB-convey width.

The second supporting table 342 is provided such that in a state in which the PWB supporting device 174 is positioned at its downward-movement-end position and accordingly the first supporting table 210 is positioned at its downward-movement-end position, the second supporting surface 344 is substantially continuous with the first supporting surface 214 on a common horizontal plane. The PWB supporting device 174 is elevated and lowered by the PWB elevating and lowering device 170 and accordingly the first supporting table 210 is moved relative to the second supporting table 342 in directions perpendicular to the supporting surfaces 214, 344. Therefore, there is a gap between the first and second supporting surfaces 214, 344 that allows the upward and downward movements of the first supporting table 210. However, this gap has only such a dimension which allows each supporting pin 212 to move or slide over it and which is sufficiently smaller than a dimension of the bottom surface 236 of the each pin 212. Thus, in a state in which the bottom surface 236 of each supporting pin 212 is held in close contact with one of the first and second supporting surfaces 214, 344, the other supporting surface can start supporting the each pin 212. In the present embodiment, in the state in which the first supporting table 210 is positioned at its downward-movement-end position, there is no step between the first and second supporting surfaces 214, 344, so that each supporting pin 212 can smoothly move from one of the two supporting surfaces 214, 344 to the other supporting surface on the common horizontal plane.

Each of the supporting pins 212 is stored at a prescribed storing position on the second supporting surface 344. For example, the second supporting surface 344 has marks defining the respective storing positions where the supporting pins 212 are stored. Those marks may be so depicted as to have the same cross-sectional shape and dimensions as those of the permanent magnet 234. In the case where an operator initially stores a plurality of supporting pins 212 in the storing device 340, the operator places those pins 212 at respective storing positions indicated by those marks on the second supporting surface 344. Those storing positions are so determined as to assure that the supporting pins 212 are set on the second supporting surface 344, with respective spaces which allow two grasping fingers 370 of a pin holder 368, described below, to be opened and closed, in the Y-axis direction, to grasp or release each pin 212 and which prevent the supporting pins 212 from interfering with each other in the X-axis direction. Since the second supporting table 342 is formed of the ferromagnetic material as described previously, each supporting pin 212 whose seat portion 222 is formed of the permanent magnet 234, is attached, owing to a magnetic force of the permanent magnet 234, to the second supporting table 342. The operation of the operator to initially store the supporting pins 212 in the storing device 340 may be automatically performed.

In the present embodiment, the attaching and detaching of each supporting pin 212 to and from the first supporting table 210 are automatically performed by utilizing the X-Y robot 48 of the EC mounting device 16. To this end, as shown in FIG. 2, the Y-axis table 42 supports a holding unit 360 which includes a holding head 362; a rotating device 364 which rotates the holding head 362 about a vertical axis line perpendicular to the first supporting surface 214 of the first supporting table 210; and an elevating and lowering device 366 which elevates and lowers the holding head 362. The holding head 362 includes a pin holder 368 as a supporting-member holder; and a finger drive device 372 that opens and closes a pair of grasping fingers 370 as part of the pin holder 368. The holding head 362 is moved relative to the first supporting table 210 by the X-Y robot 458 in directions parallel to the first supporting surface 214, and is moved relative to the same 210 by the elevating and lowering device 366 in directions perpendicular to the first supporting surface 214. The X-Y robot 48 and the holding unit 360 cooperate with each other to provide a mechanical portion of an automatic resetting apparatus 374; and the mechanical portion cooperates with the storing device 340 and a portion of a control device 500, described later, that controls the mechanical portion, to provide the automatic resetting apparatus 374 which automatically resets the PWB supporting device 174.

Figure 7:
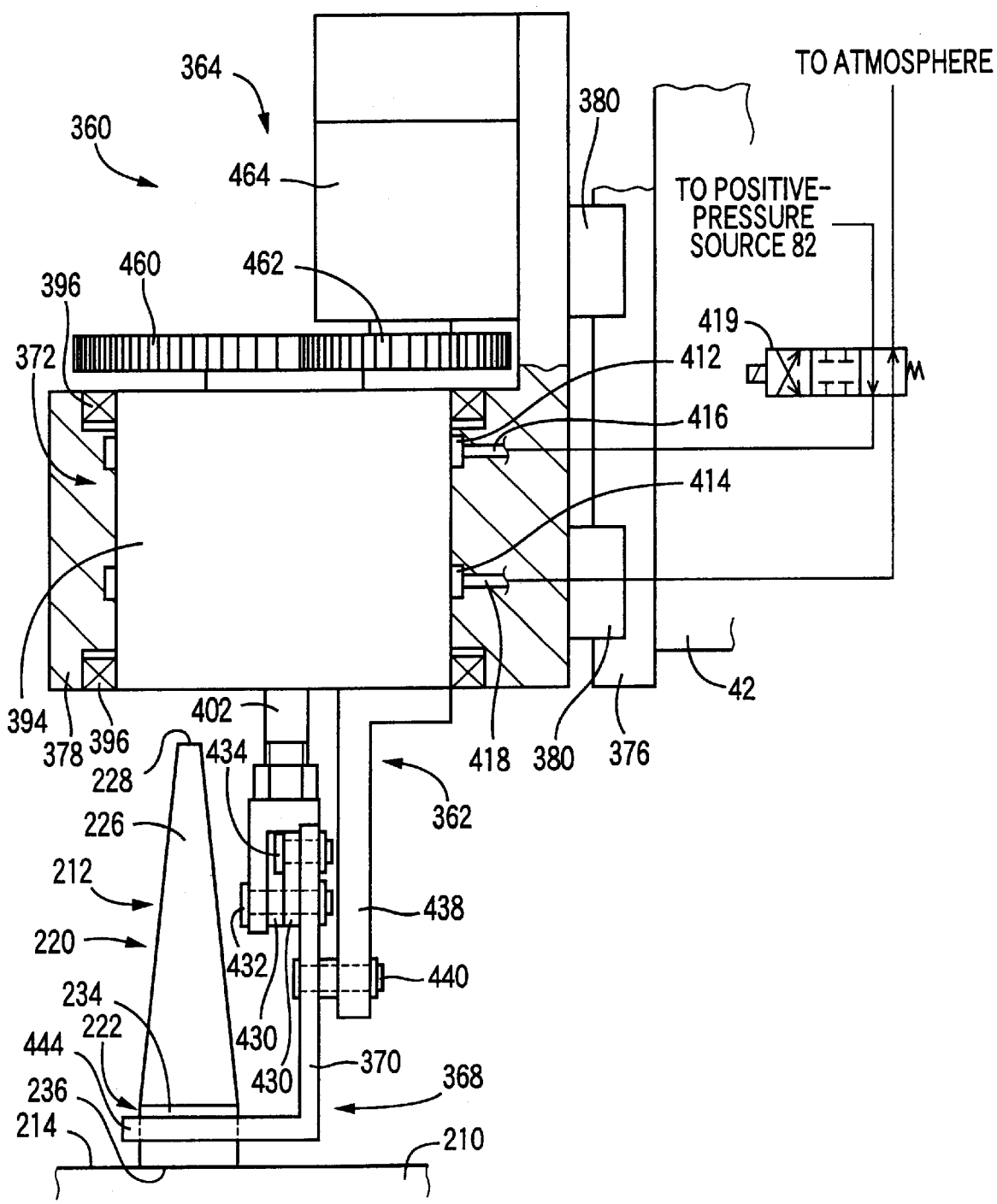
FIG. 7 is a partly cross-sectioned, rear elevation view of a holding unit including the holding head.
Figure 8:
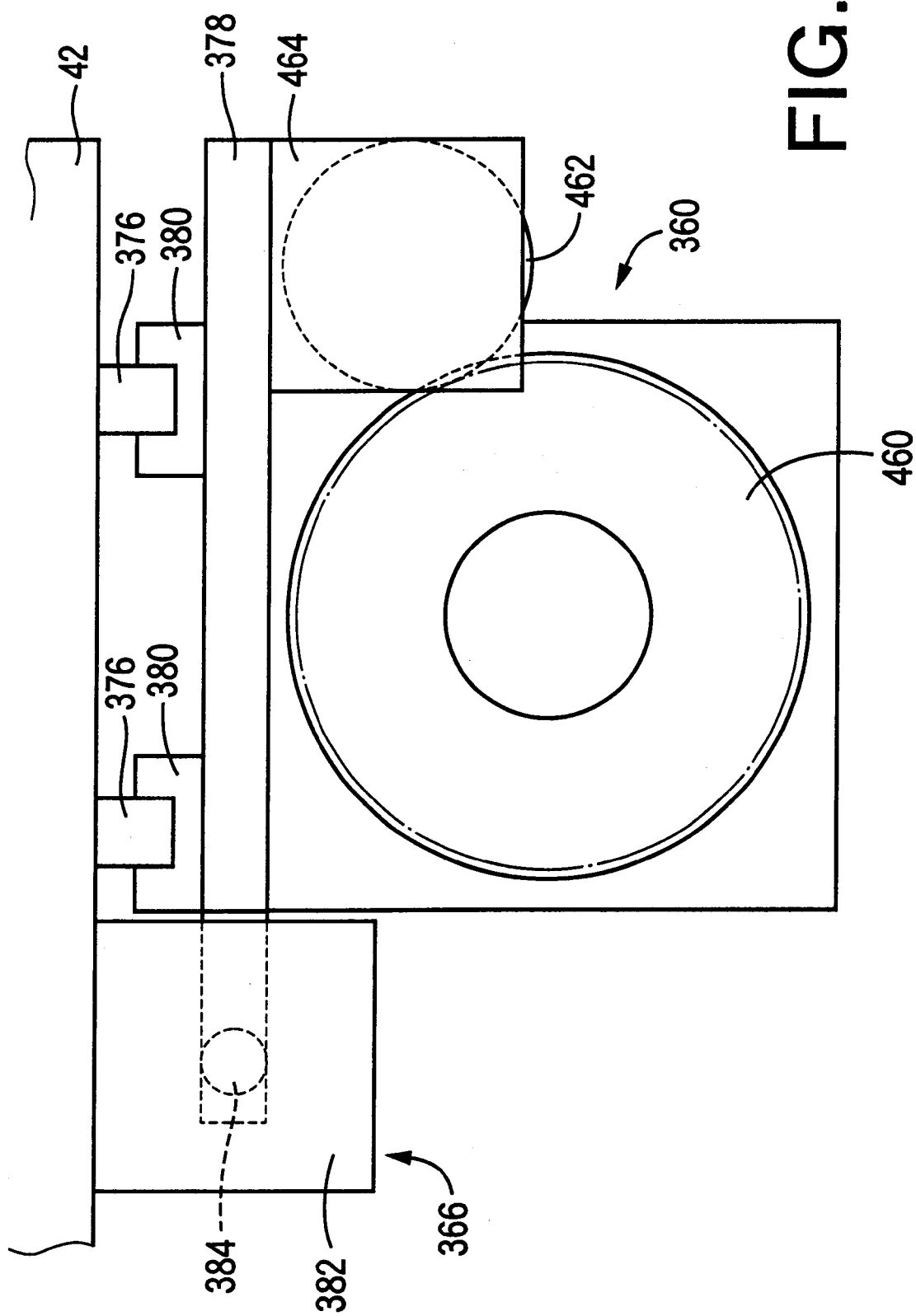
FIG. 8 is a plan view of the holding unit.

As shown in FIGS. 2 and 7, the vertical side surface 50 of the Y-axis table 42 supports a pair of guide rails 376 each as a guide member, such that the guide rails 376 are vertical, and an elevator table 378 fits via respective guide blocks 380 each as a guided member on the guide rails 376, such that the elevator table 378 is movable relative to the Y-axis table 42. In addition, the Y-axis table 42 supports a pressurized-air-operated cylinder device 382 as a pneumatic actuator as a sort of a pressurized-fluid-operated actuator, such that the air-operated cylinder 382 is oriented downward. As shown in FIGS. 2 and 8, a piston rod 384 is engaged with the elevator table 378. Two air chambers of the air-operated cylinder 382 are selectively communicated with the positive-pressure source 82 and the atmosphere, respectively, or the atmosphere and the source 82, respectively, by a switching operation of a solenoid-operated direction-switch valve 386, so that the piston rod 384 is advanced or retracted and the elevator table 378 is lowered or elevated. Thus, the air-operated cylinder 382 and others provide the elevating and lowering device 366. Since the holding head 362 is positioned at its upward-movement-end position when the EC mounting head 30 mounts the ECs 32 on the PWB 24, the holding head 362 does not obstruct the EC mounting head 30 from mounting the ECs 32 on the PWB 24. In the present embodiment, the direction-switch valve 386 is mounted on the Y-axis table 42, and is connected to the positive-pressure source 82 via the previously-described connector provided on the Y-axis table 42.

Figure 5:
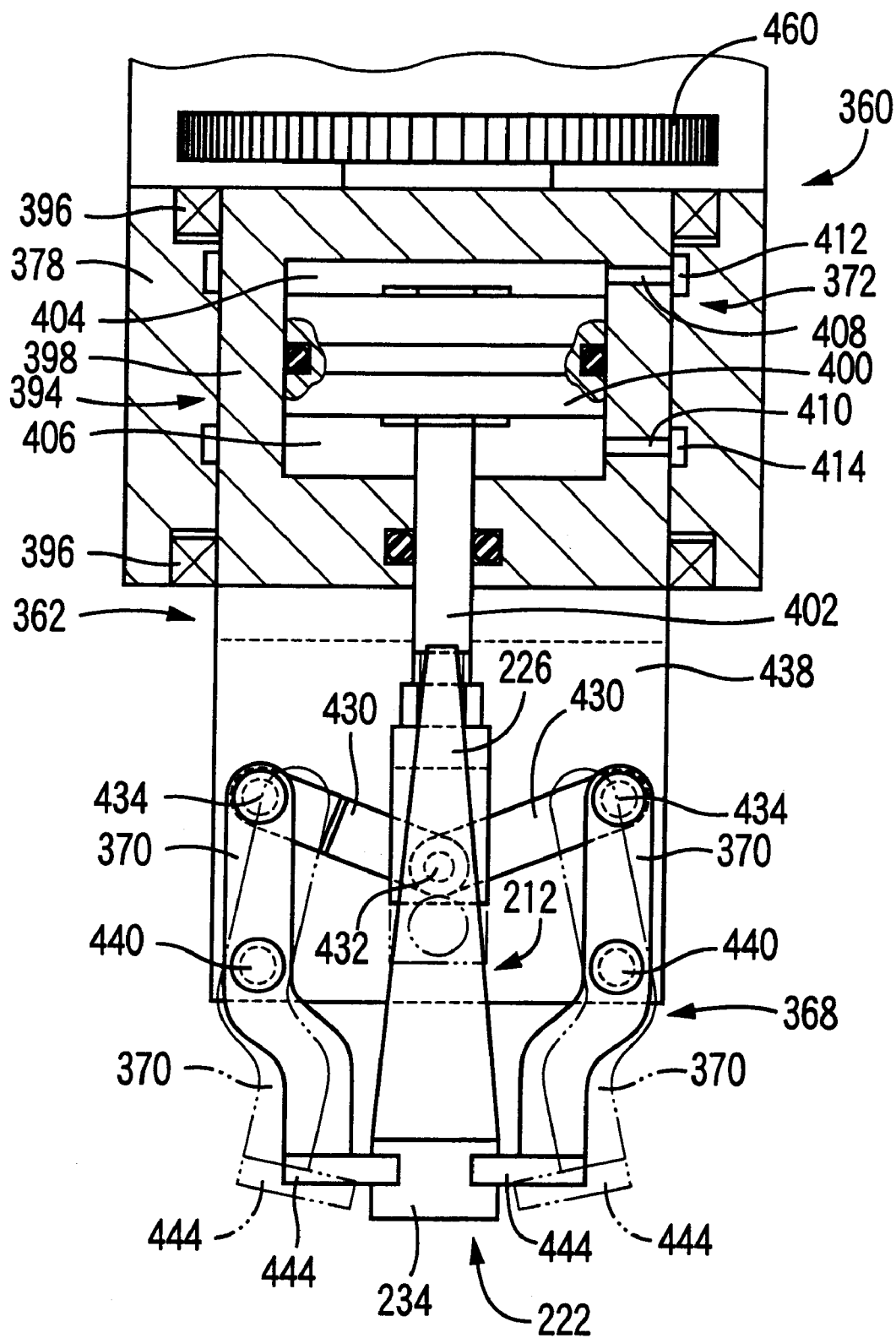
FIG. 5 is a partly cross-sectioned, side elevation view of a holding head including the pin holder.

As shown in FIGS. 5 and 7, the elevator table 378 supports a pressurized-air-operated cylinder device 394 via bearings 396 such that the air-operated cylinder 394 is rotatable relative to the elevator table 378 about a vertical axis line and is not movable relative to the table 378 in an axial direction. A piston 400 air-tightly fits in a housing 398 of the air-operated cylinder 394 that has a circular cross section, such that the piston 400 is movable relative to the housing 398 in an axial direction. A piston rod 402 which is integral with the piston 400 projects downward from the piston 400, air-tightly through the wall of the cylinder housing 398, and extends out of the housing 398.

The piston 400 fits in the cylinder housing 398, so that two air chambers 404, 406 are provided on both sides of the piston 400, respectively, and are connected to the positive-pressure source 82 via respective ports 408, 410 formed in the housing 398, respective annular passages 412, 414 formed in the elevator table 378, respective passages 416, 418 (FIG. 7), and a solenoid-operated direction-switch valve 419. The direction-switch valve 419 is connected to the above-described connector and to the positive-pressure source 82. Thus, the two air chambers 404, 406 are communicated with the positive-pressure source 82 and the atmosphere, respectively, or vice versa, by a switching operation of the direction-switch valve 519, so that the piston 400 is moved and the piston rod 402 is advanced or retracted.

In the present embodiment, the various solenoid-operated direction-switch valves including the valve 68 are mounted on the Y-axis table 42, and the switching operations to switch the respective supplies of the positive pressure and the negative pressure to the various devices, including the EC mounting head 30, that are mounted on the Y-axis table 42 and need the positive pressure and the negative pressure are performed on the Y-axis table 42. Therefore, the distance between each of the direction-switch valves and a corresponding one of the devices that are operated based on the positive-pressure air or the negative pressure is short, and accordingly those devices exhibit a quick response.

As shown in FIG. 5, a pair of links 430 are attached, at respective one end portions thereof, to a lower end portion of the piston rod 402 via a pin 432, such that each of the links 430 is pivotable about a horizontal axis line. Respective other end portions of the links 430 are connected to two grasping fingers 370 via respective pins 434, such that each of the fingers 370 is pivotable about a horizontal axis line. One of the two links 430 is bent in a lengthwise intermediate portion thereof, so that the respective end portions of the two links 430 connected to the two grasping fingers 370 are positioned on a common plane and accordingly the two grasping fingers 370 are positioned on a common plane.

Figure 6:
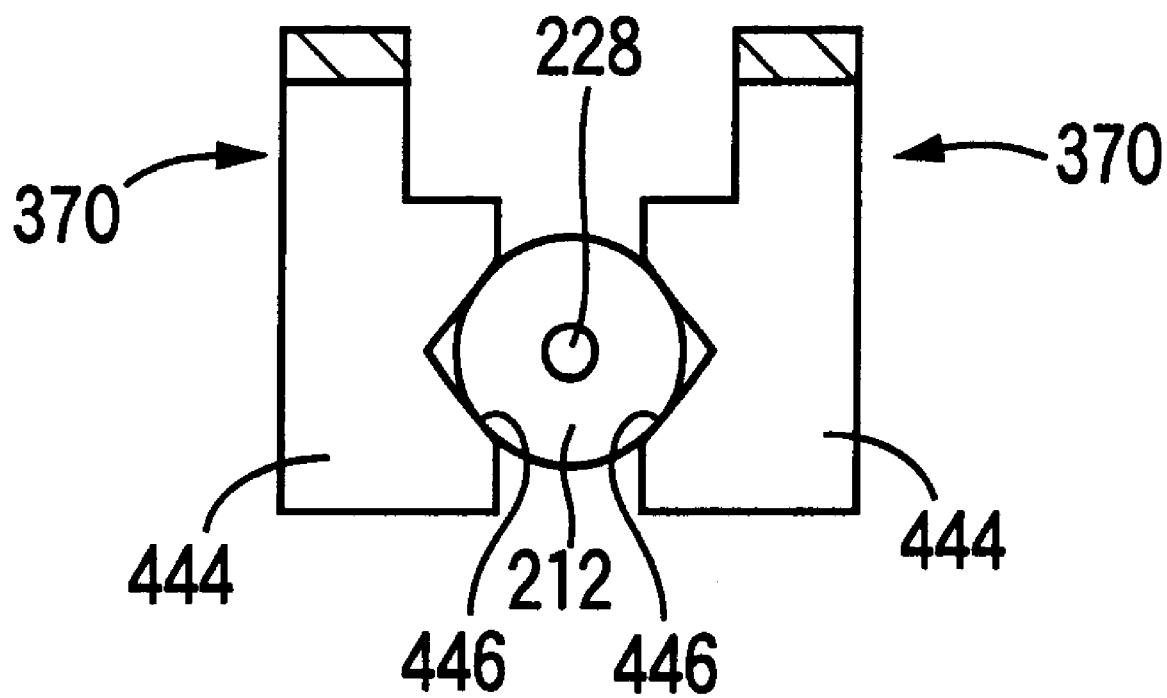
FIG. 6 is a partly cross-sectioned plan view of the pin holder holding a supporting pin.

Each of the two grasping fingers 370 has a plate-like shape, and is pivotally connected at a lengthwise intermediate portion thereof via a pin 440 to a bracket 438 integral with the cylinder housing 398. Each one of the two grasping fingers 370 is bent, in a portion thereof below the portion thereof connected to the bracket 438, toward the other finger 370, so that respective lower half portions of the two fingers 370 extend downward parallel to each other. Respective lower end portions of the two grasping fingers 370 are perpendicularly bent in a direction away from the bracket 438, and provide respective engaging portions 444. As shown in FIG. 6, each of the engaging portions 444 has, at a free end thereof, a recess 446 having a V-shaped cross section.

When the piston rod 402 is moved downward, the two grasping fingers 370 are pivoted, as indicated at two-dot-chain line, such that the respective engaging portions 444 are moved away from each other, so that the supporting pin 212 is released. On the other hand, when the piston rod 402 is moved upward, the two grasping fingers 370 are pivoted, as indicated at solid line, such that the respective engaging portions 444 are moved toward each other, so that the supporting pin 212 is grasped. Thus, the piston rod 402, the links 430, the grasping fingers 370, and the bracket 438 are so connected to one another that the grasping fingers 370 grasp and release the supporting pin 212 owing to a toggle mechanism. Thus, the supporting pin 212 is strongly grasped by the pin holder 368. In the present embodiment, the bracket 438 provides a main member of the pin holder 368 that cooperates with the two links 430 and the two grasping fingers 370 to provide the pin holder 368. The air cylinder 394 and others provide the finger drive device 372.

A driven gear 460 is provided on an upper surface of the cylinder housing 398, such that the driven gear 460 is coaxial with the housing 398 and is not rotatable relative to the same 398. As shown in FIG. 8, the driven gear 460 is meshed with a drive gear 462 and, when the drive gear 462 is rotated by a rotating motor 464, the drive gear 462 is rotated, so that the air cylinder 394 is rotated about the vertical axis line and the pin holder 368 is rotated about the same vertical axis line. The rotating motor 464 are provided on the elevator table 378, and cooperates with the drive gear 462, the driven gear 460, and others to provide the rotating device 364. The air chambers 404, 406 of the air cylinder 394 are supplied with the air via the respective annular passages 412, 414, so that even if the air cylinder 394 is rotated, the air chambers 404, 406 can continuously receive the air.

Figure 9:
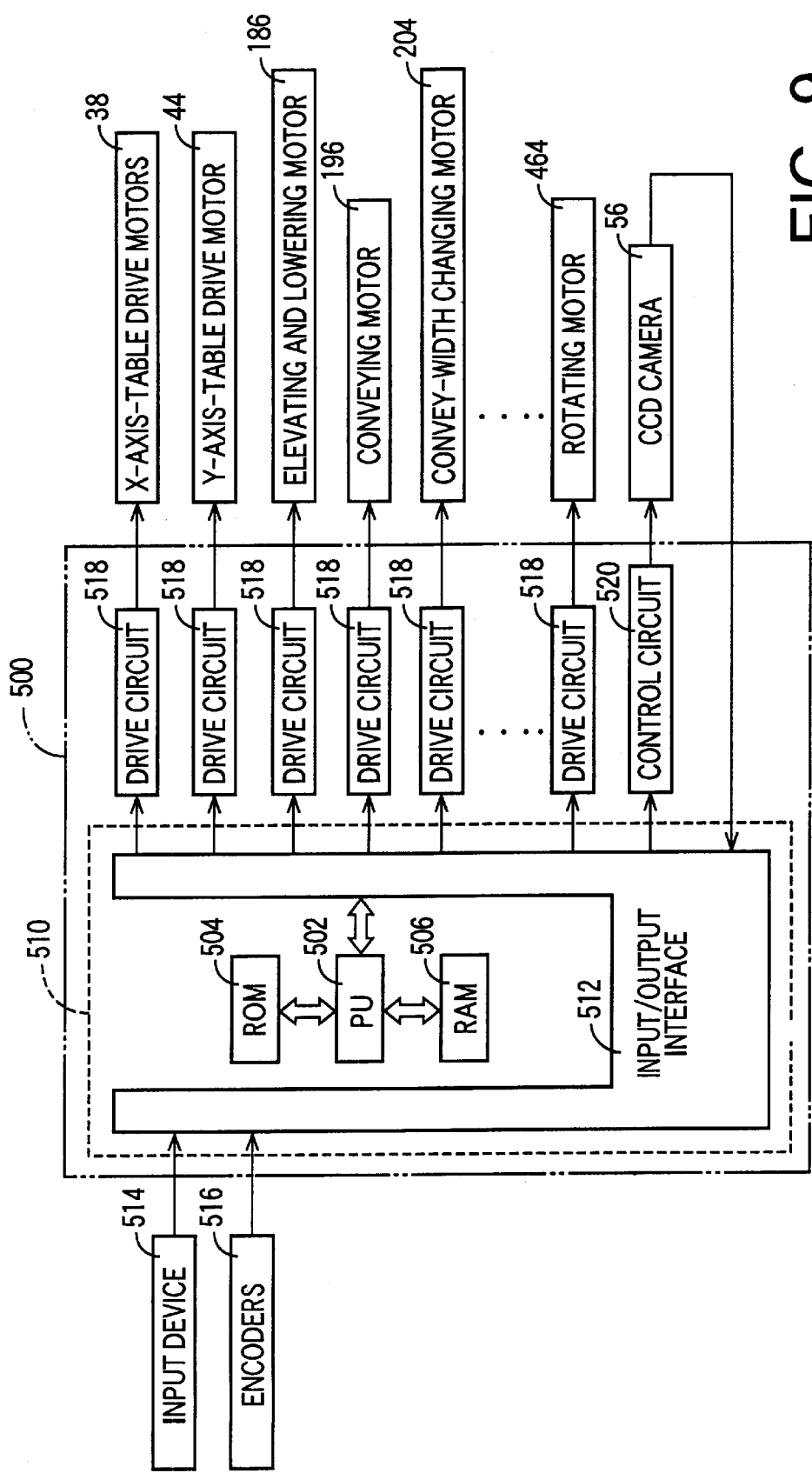
FIG. 9 is a diagrammatic view of a control device which controls the EC mounting system.

The present EC mounting system 12 is controlled by a control device 500 shown in FIG. 9. The control device 500 is essentially provided by a computer 510 including a PU (processing unit) 502, a ROM (read only memory) 504, a RAM (random access memory) 506, and a bus which connects those elements 502, 504, 506 to one another. An input/output interface 512 is connected to the bus of the computer 510, on one hand, and is connected, on the other hand, to the CCD camera 56, an input device 514, encoders 516, etc. The encoders 516 are rotation detecting devices which detect respective rotation angles of the two X-axis-table drive motors 38. FIG. 9 shows only the encoders 516 for the X-axis-table drive motors 38, as representatives of all encoders, and the other electric motors including the Y-axis-table drive motor 44, employed in the present system 12, than the X-axis-table drive motors 38, are provided with respective encoders to detect respective rotation angles thereof. The input device 514 includes ten keys, function keys, etc., and is operable by an operator to input various data.

Various actuators including the X-axis drive motors 38 are additionally connected via respective drive circuits 518 to the input/output interface 512, and the CCD camera 56 is connected via a control circuit 520 to the interface 512. Each of the motors, including the motors 38, is a servomotor as a sort of electric motor as a drive source. However, the servomotors may be replaced with a different sort of motors which can be controlled with respect to rotation angle or amount; for example, stepper motors. The drive circuits 518 and the control circuit 520 cooperate with the computer 510 to provide the control device 500.

Figure 12:
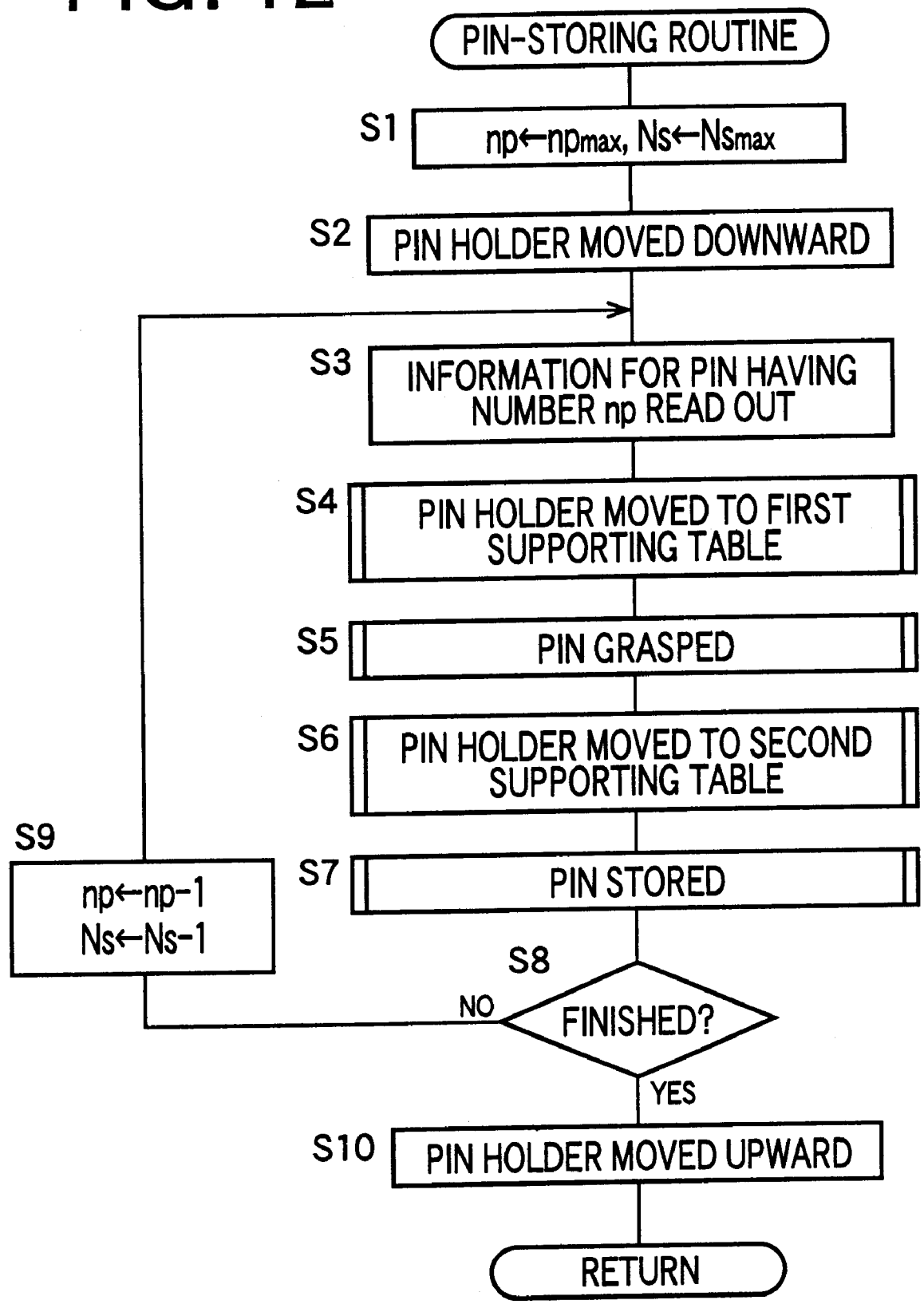
FIG. 12 is a flow chart representing a pin-storing routine which is stored in a ROM (read only memory) of a computer as an essential part of the control device.
Figure 13:
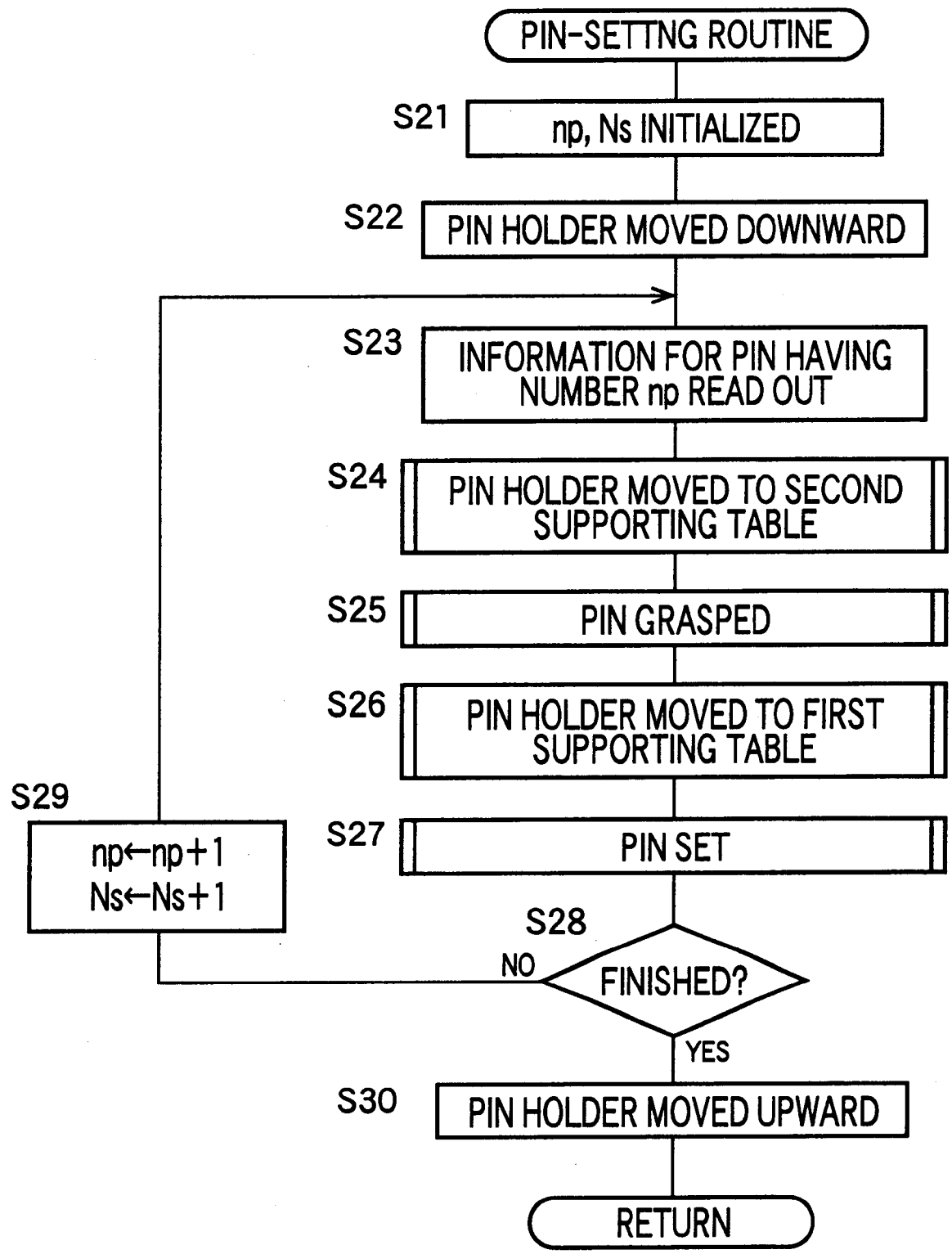
FIG. 13 is a flow chart representing a pin-setting routine which is stored in the ROM.

The ROM 504 stores a main routine, not shown; a pin-storing routine and a pin-setting routine which are represented by respective flow charts shown in FIGS. 12 and 13; and a plurality of sorts of manufacturing programs each as a program used for mounting ECs 32 on PWBs 24. The RAM 506 stores a plurality of batches of pin-setting information used for setting the supporting pins 212 on the first supporting table 210, and pin-storing information used for storing the supporting pins 212 in the storing device 340. The plurality of batches of pin-setting information correspond to a plurality of sorts of PWBs 24, respectively.

Each batch of pin-setting information includes data representing a total number of the supporting pins 212 that are to be set on the first supporting table 210. For each supporting pin 212, the pin-setting information additionally includes setting-position data representing a setting position where the each supporting pin 212 is to be set on the first supporting surface 214 of the first supporting table 210. In the present embodiment, the first supporting surface 214 is a horizontal surface, and the setting-position data are horizontal-direction-position data representing at least one position, in at least one horizontal direction, where each supporting pin 212 is to be set on the first supporting surface 214.

In the present embodiment, the horizontal-direction position of each supporting pin 212 is so determined as to satisfy both a first condition prescribed for the PWB 24 and a second condition prescribed for the PWB supporting device 174. The first condition is that each supporting pin 212 can engage a portion of the PWB 24 that is free of the ECs 32 mounted thereon and is free of unevenness and the support surface 228 can closely contact the PWB 24 without interfering with the ECs 32 mounted thereon, etc. A batch of design data for each sort of PCB 24 includes data representing respective positions on the back surface 215 of the PWB 24 where ECs 32 are to be mounted, and respective positions where the back surface 215 of the PWB 24 has unevenness. Since each supporting pin 212 can be set at any position on the first supporting surface 214, the second condition is that the each supporting pin 212 does not interfere with the other supporting pins 212. Thus, the respective horizontal-direction positions of the supporting pins 212 are so prescribed automatically, or by an operator, as to satisfy both the condition prescribed for the PWB 24 and the condition prescribed for the PWB supporting device 174.

Each of a plurality of supporting pins 212 to be set on the first supporting table 210 is given a pin number, np, and a batch of pin-setting information includes, in association with each pin number np, a horizontal-direction position of the corresponding supporting pin 212, as schematically shown in FIG. 10. The horizontal-direction position of each supporting pin 212 with the pin number np is expressed by a set of X and Y coordinates, ($X_{np}$, $Y_{np}$), of the center thereof (i.e., the axis line of the pin 226 thereof). The sequential pin numbers np represent a prescribed setting order in which the supporting pins 212 are to be set on the first supporting table 210. In the present embodiment, the setting order is so prescribed that the earlier supporting pins 212 are set at the remoter setting positions on the first supporting table 210 from the storing device 340.

Figure 11:
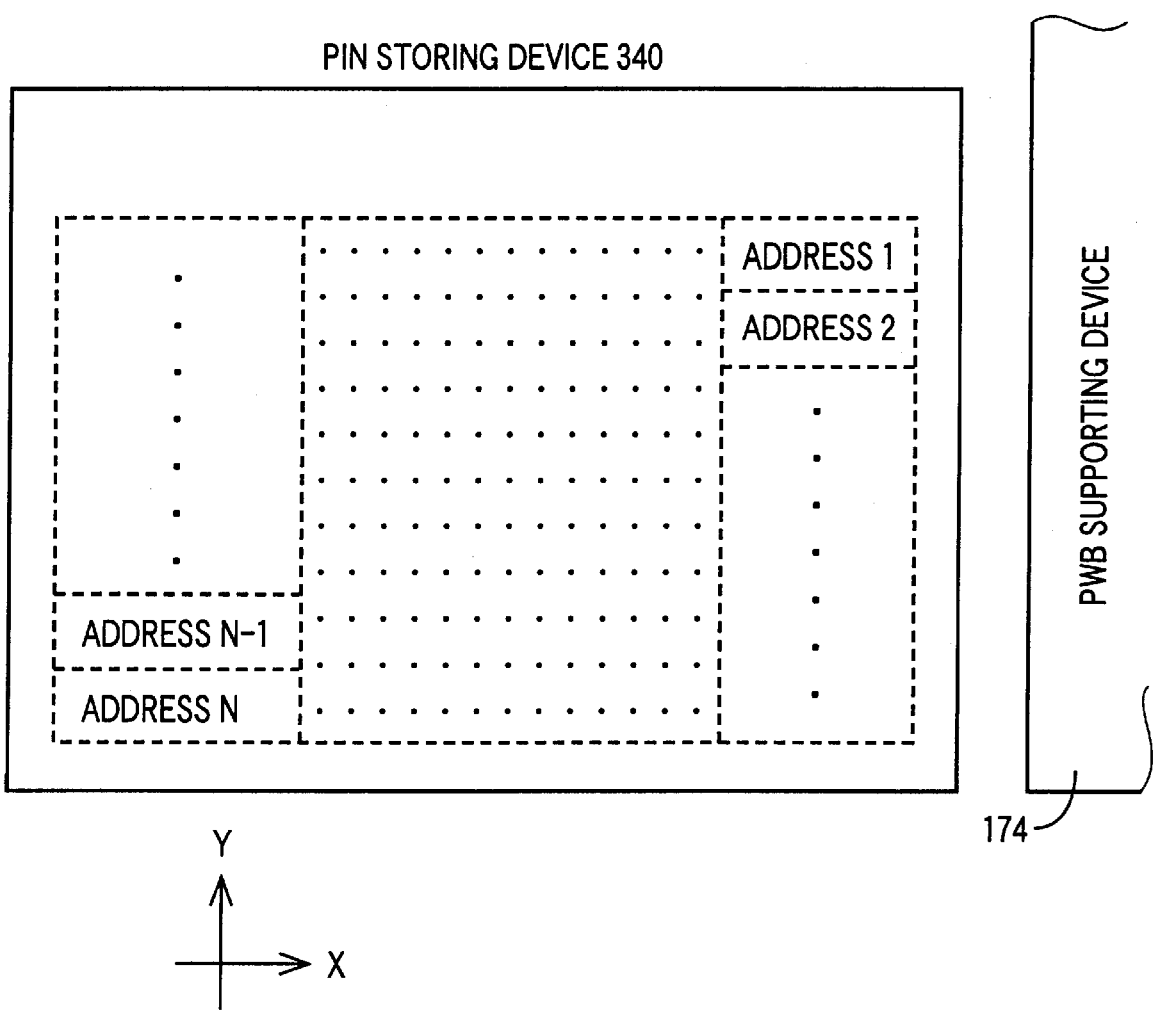
FIG. 11 is a view for explaining a manner in which the supporting pins are stored in a storing device.

In the present embodiment, a batch of pin-storing information is input by the operator through the input device 514, and is stored in the RAM 506. In the present embodiment, the pin-storing information includes an address representing a storing position where each supporting pin 212 is stored on the second supporting table 342 of the storing device 340. As schematically shown in FIG. 11, each of the storing positions on the second supporting table 342 of the storing device 340 is given an address, N. In the present embodiment, the smaller addresses N are given to the nearer storing positions to the PWB supporting device 174. A relationship between each address N, and X and Y coordinates representing the corresponding storing position is defined by a prescribed table which is stored in the ROM 504. The storing position represented by the X and Y coordinates is a position which is taken by the axis line of the pin 226 of each supporting pin 212.

The storing device 340 stores a sufficiently large number of supporting pins 212 that can support each of a plurality of sorts of PWBs 24. As described previously, the supporting pins 212 are initially stored in the storing device 340, by the operator. More specifically described, the supporting pins 212 are stored in the respective storing positions, i.e., respective consecutive addresses in the storing device 340, such that there are no empty addresses among the addresses filled with the pins 212. The operator inputs, as the pin-storing information, the smallest address that is the nearest to the PWB supporting device 174 and the largest address that is the remotest from the same 174, and the input pin-storing information is stored in the RAM 506. A plurality of batches of pin-setting information are prescribed for a plurality of sorts of PWBs 24, respectively, but a single batch of pin-storing information is commonly used for a plurality of sorts of PWB supporting devices 174 having different patterns of pin-setting positions corresponding to the different sorts of PWBs 24, respectively.

In the EC mounting system 12 constructed as described above, ECs 32 are mounted on a PWB 24 according to one of the manufacturing programs which are stored in the ROM 504. The operator can select, through the input device 514, an appropriate one of the manufacturing programs. If a different manufacturing program has been used before the thus selected manufacturing program, a resetting operation is automatically performed before the selected manufacturing program is carried out. The resetting operation includes changing the PWB-convey width of the PWB conveyor 22, exchanging the ECs 32 supplied by the EC supplying device 18, rearranging the supporting pins 212 of the PWB supporting device 174, and so on. After the resetting operation, ECs 32 are mounted on a PWB 24 according to the newly selected manufacturing program. Hereinafter, first, there will be described a manner in which the supporting pins 212 are attached to the first supporting table 210 to support the PWB 24 and ECs 32 are mounted on the PWB 24.

The bottom surface 236 of each supporting pin 212 is seated on the first supporting surface 214. The seat portion 222 of each supporting pin 212 is formed of the permanent magnet 234, and the first supporting table 210 is formed of a ferromagnetic material, a portion of the first supporting surface 214 where each supporting pin 212 is set on is magnetized, and accordingly the each supporting pin 212 is attracted and attached, owing to the magnetic force, to a prescribed setting position on the first supporting table 210.

Figure 14:
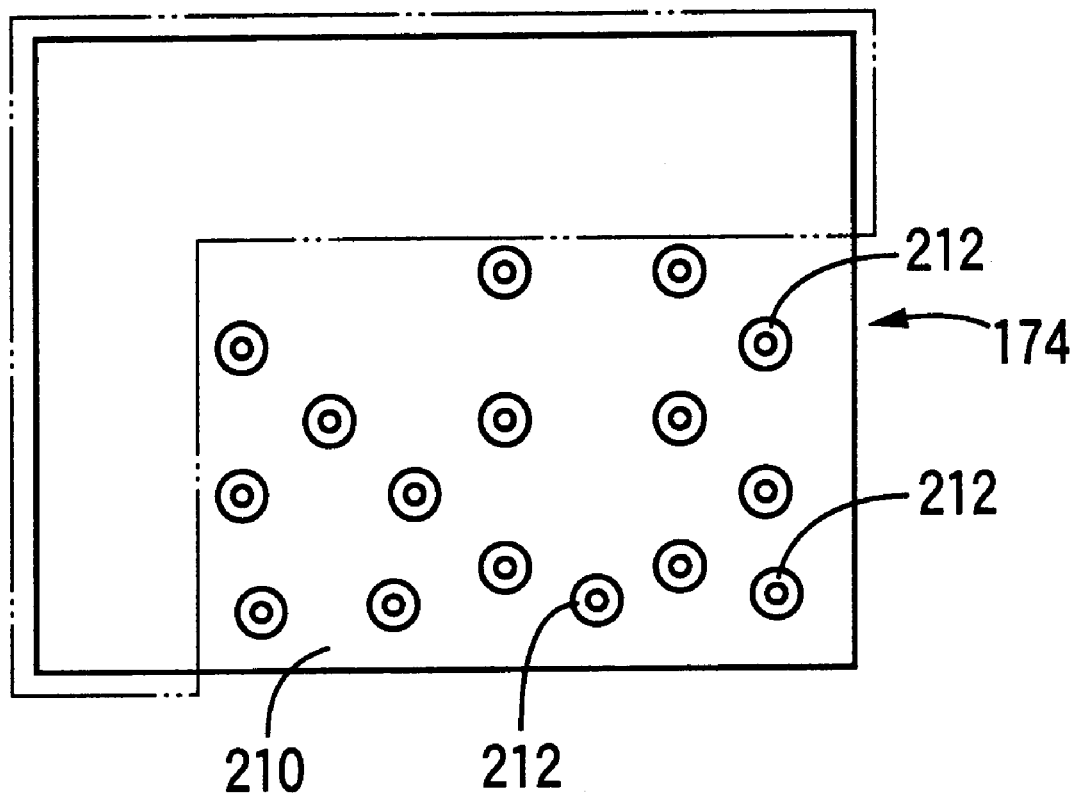
FIG. 14 is a plan view for explaining a state in which the supporting pins are set on a first supporting table of the PWB supporting device.

As described previously, the back surface 215 of the PWB 24, opposite to the upper or front surface thereof on which ECs 32 are to be mounted, has some ECs 32 already mounted thereon and some uneven portions. Thus, each supporting pin 212 must support one of limited portions of the back surface 215. Meanwhile, the first supporting table 210 is used commonly for a plurality of sorts of PWBs 24, and has a size greater than that of the largest one of the different sorts of PWBs 24. Thus, as shown in FIG. 14, the first supporting table 210 includes a first area, indicated at two-dot-chain line, which is not aligned with the PWB 24 because the PWB 24 is smaller than the table 210 and to which no supporting pins 212 are attached, and a second area which is aligned with the PWB 24 and to which some supporting pins 212 are attached.

When ECs 32 are mounted on a WB 24, the PWB 24 is carried in by the PWB conveyor 22. At this time, the PWB supporting device 174 is held at its downward-movement-end position by the PWB elevating and lowering device 170, so that the PWB 24 is carried in to a position right above the PWB supporting device 174 and aligned with the first supporting table 210, and is contacted with, and stopped by, the stopper, not shown. Then, the PWB supporting device 174 is moved upward to its upward-movement-end position by the elevating and lowering device 170. When the PWB supporting device 174 is moved upward, the supporting pins 212 lift up the PWB 24 off the conveyor belts 192.

In the present embodiment, the distance of movement of the PWB supporting device 174 is equal to a value which is obtained by subtracting the thickness of the PWB 24 from the distance between the hold-down portions 194 and the support surfaces 228 of the supporting pins 212 positioned at their downward-movement-end position. In the state in which the PWB supporting device 174 is positioned at its upward-movement-end position, the support surfaces 228 of the supporting pins 212 engage the PWB 24, and support the lower surface 215 of the PWB 24. Therefore, if the PWB 24 has a downwardly convex warpage, the warpage of the PWB 24 is pushed up by the support surfaces 228 of the supporting pins 212. Thus, the PWB 24 is so corrected as to extend along a plane, and the PWB supporting device 174 supports the PWB 24 such that the PWB 24 takes a horizontal posture.

After the PWB supporting device 174 is moved upward, the previously-described clamping plates provided on the fixed and movable rails 188, 190 are moved upward by the clamping cylinders, so that the respective end portions of the PWB 24 that extend parallel to the PWB-convey direction are sandwiched and held by the clamping plates and the PWB hold-down portions 194.

After in this way the PWB 24 is held by the PWB supporting device 174, the X-Y robot 48 moves the CCD camera 56 to a plurality of positions at each of which the CCD camera 56 is opposed to a corresponding one of a plurality of fiducial marks provided on the PWB 24. Based on a batch of image data representing the taken images of the fiducial marks, the computer 510 determines positional errors of the PWB 24 held by the PWB supporting device 174, and stores the determined positional errors in the RAM 506. Subsequently, the EC mounting head 30 picks up an EC 32 from the EC supplying device 18 and conveys the EC 32 to a position right above an EC-mount place on the PWB 24. During the conveying of the EC 32, the EC-image-taking CCD camera takes an image of the EC 32 held by the head 32 and, based on a batch of image data representing the taken image of the EC 32, the computer 510 determines positional errors of the EC 32 held by the head 32. Based on the positional errors of the PWB 24 and the positional errors of the EC 32, the computer 510 modifies the distance of movement of the EC 32, and controls the rotating device 54 to rotate the EC 32, so as to correct the positional errors of the PWB 24 and the EC 32. After this correcting step, the EC 32 is stably mounted, with a correct rotation position thereof, at a correct EC-mount place on the PWB 24 whose back surface 25 is supported by the respective support surfaces 228 of the supporting pins 212.

After the ECs 32 are mounted on the PWB 24, the PWB supporting device 174 is moved downward to its downward-movement-end position. At this time, the clamp plates release the PWB 24. The PWB 24 is moved downward with the PWB supporting device 174, so that the PWB 24 is supported on the conveyor belts 192 of the PWB conveyor 22. When the PWB supporting device 174 is further lowered, the supporting pins 212 are moved away from the PWB 24. Then, the PWB 24 is carried out, by the PWB conveyor 22, from the position aligned with the first supporting table 210, and another PWB 24 is carried in so that ECs 32 are mounted on the new PWB 24.

After the ECs 32 have been mounted on the PWBs 24 according to the current manufacturing program, the current PWB supporting device 174 is reset, before another manufacturing program is carried out. Hereinafter, the resetting of the PWB supporting device 174 will be described.

A PWB-holding-device resetting operation is automatically performed according to the pin-storing routine and the pin-setting routine shown in FIGS. 12 and 13, and based on the pin-setting information and the pin-storing information to set and store the supporting pins 212. The current group of supporting pins 212 which are currently set on the first supporting table 210 are reset from the table 210, according to the current pin-setting information, and a new group of supporting pins 212 are set on the table 210, according to new pin-setting information which is prescribed to set the PWB supporting device 174 so that the supporting device 174 holds a new sort of PWB 24 on which ECs 32 are to be mounted.

A resetting operation is started in response to, e.g., a command input by an operator. When the computer 510 receives the resetting-start command, the computer 510 carries out the pin-storing routine and the pin-setting routine so that the automatic resetting apparatus 374 is operated to perform the resetting operation. Prior to the resetting operation, the movable rail 190 is moved away from the fixed rail 188, so that a maximal distance is present between the two rails 188, 190. In addition, the resetting of the PWB supporting device 174 is performed in a state in which the PWB 24 has been carried, by the PWB conveyor 22, out of the supporting device 174 and accordingly a vacant space is present above the supporting device 174. In this state, the supporting device 174 is positioned at its downward-movement-end position, and accordingly the first and second supporting surfaces 214, 344 are substantially continuous with each other on the common horizontal plane. In this state, the PWB supporting device 174 is automatically reset. When the computer 510 receives the resetting-start command, the computer 510 successively carries out both the pin-storing routine and the pin-setting routine, in a normal case. However, in a special case where only the storing, or only the setting, of the supporting pins 212 is commanded, the computer 510 operates for performing only the storing or setting according to that command.

The storing and setting of the supporting pins 212 according to the pin-storing routine and the pin-setting routine are briefly described below.

In the present embodiment, first, all the supporting pins 212 currently attached to the first supporting table 210 are detached from the table 210 and returned to the storing device 340. The detaching of the supporting pins 212 is performed according to the pin-storing information, and the current pin-setting information prescribed for the supporting pins 212 currently set on the table 210. The supporting pins 212 are detached from the table 210, in an order reverse to the order in which those pins 212 had been attached to the same 210. More specifically described, the X-Y robot 48 moves, according to the setting-position data for each supporting pin 212, the pin holder 368 to the each pin 212 so that the pin holder 368, positioned at its downward-movement-end position by the elevating and lowering device 366, grasps the each pin 212. Then, in the state in which the pin holder 368 remains positioned at its downward-movement-end position, the X-Y robot 48 moves, according to the storing-position data for the each pin 212, the pin holder 368 to the storing device 340, while the each pin 212 slides on the first and second supporting surfaces 214, 344. Thus, the each pin 212 is stored in the storing device 340. After all the current supporting pins 212 are stored in the storing device 340, appropriate supporting pins 212 are taken out of the storing device 340 and are set on the first supporting table 210. This setting is performed according to new pin-setting information to set new supporting pins 212 on the first supporting table 210 to support a new sort of PWBs 24. More specifically described, the X-Y robot 48 moves the pin holder 368 to each supporting pin 212 in the storing device, so that the pin holder 368, positioned at its downward-movement-end position by the elevating and lowering device 366, grasps the each pin 212. Then, in the state in which the pin holder 368 remains positioned at its downward-movement-end position, the X-Y robot 48 moves, according to the setting-position data for the each pin 212, the pin holder 368 to a prescribed setting position on the first supporting table 210, while the each pin 212 slides on the second and first supporting surfaces 344, 214. Thus, the each pin 212 is set on the first supporting table 210. Thus, the pin holder 368 is kept at its downward-movement-end position, while each supporting pin 212 is stored in the storing device 340, or is set on the first supporting table 210.

Next, there will be described in detail the storing and setting of the supporting pins 212 according to the pin-storing routine and the pin-setting routine shown in FIGS. 12 and 13.

If a PWB-supporting-device resetting command is received by the computer 510, first, the pin-storing routine is carried out by the same 510. At Step S1 (hereinafter, simply referred to as S1; this applies to the other steps), a pin number np and a pin-storing address Ns are initialized by the computer 510. In the present embodiment, a plurality of supporting pins 212 which are attached to the first supporting table 210 are detached from the table 210 in an order reverse to an order in which those pins 212 are attached to the table 210, and are stored in the storing device 340 in an order reverse to an order in which those pins 212 are taken out. The order in which the supporting pins 212 are taken out is prescribed such that the pins 212 stored at the nearer storing positions to the first supporting table 210, i.e., the storing positions having the smaller addresses are earlier taken out. Therefore, the pins 212 set on the first supporting table 210 at the nearer setting positions to the storing device 340 are earlier detached, and are earlier stored in the storing device 340 at the remoter storing positions from the first supporting table 210, i.e., the storing positions having the greater addresses. Therefore, the supporting pins 212 set at the nearer setting positions on the first supporting table 210 to the storing device 340 (i.e, the supporting pins having the greater pin numbers np) are earlier detached from the table 210, and are earlier stored at the remoter storing positions (i.e., the storing positions having the greater addresses) in the storing device 340 from the table 210. Thus, at S1, np and Ns are initialized to $np_{max}$ and $Ns_{max}$, respectively. The symbol, $np_{max}$, means the total number of supporting pins 212 currently set on the first supporting table 210, and is obtained from the current pin-setting information. The symbol, $Ns_{max}$, means the greater one of the greater and smaller pin-storing addresses which cooperate with each other to define a current pin-storing range in the storing device 340, and is obtained from the pin-storing information.

Figure 15:
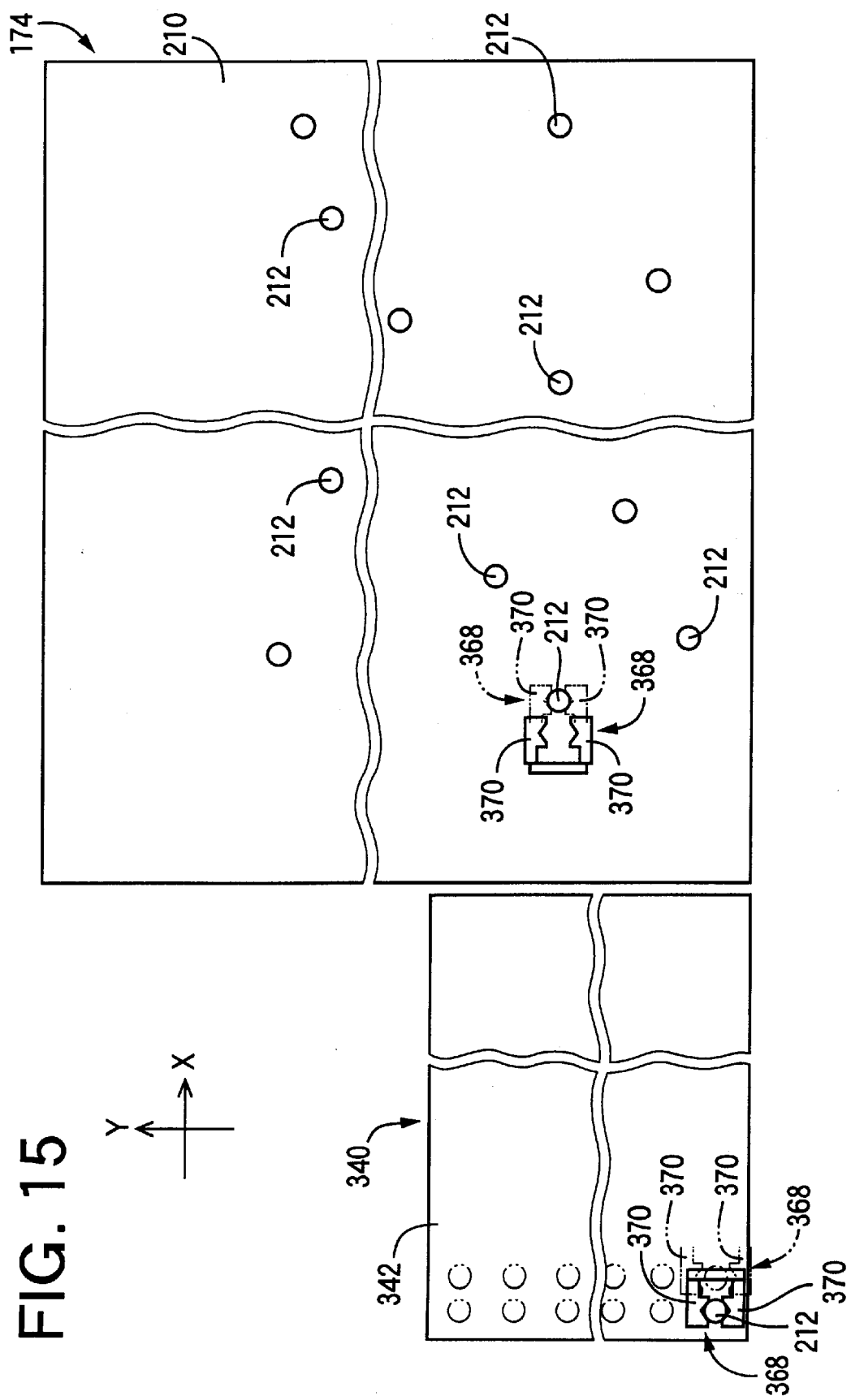
FIG. 15 is a view for explaining a manner in which the supporting pins are stored when the PWB supporting device is reset.

Next, at S2, the pin holder 368 is lowered, by the elevating and lowering device 366, to its downward-movement-end position. Then, at S3, information relating the supporting pin 212 having the pin number np is obtained from the pin-setting information. More specifically described, prescribed horizontal-direction-position coordinates (Xnp, Ynp) representing the prescribed setting position where the pin 212 is set on the first supporting table 210 are read out from the RAM 506. Then, at S4, the X-Y robot 48 moves the holding unit 360, according to the horizontal-direction-position data for the pin 212. In the present embodiment, as schematically indicated at solid line in FIG. 15, the pin holder 368 is moved to a position which is adjacent to the pin 212, on the side of the storing device 340, in the X-axis direction. During this movement, the holding head 362 is rotated so that the direction in which the two grasping fingers 370 are arranged and are opened and closed is parallel to the Y-axis direction and so that the respective engaging portions 444 of the two grasping fingers 370 of the pin holder 368 extend, toward the pin 212, from the position adjacent to the pin 212, on the side of the storing device 340, in the X-axis direction.

Then, at S5, the pin holder 368 holds the supporting pin 212. Normally, the two grasping fingers 370 are kept opened. The pin holder 368, positioned at its downward-movement-end position, is moved toward the pin 212, so that the pin 212 is positioned between the two grasping fingers 370 being opened, as indicated at two-dot chain line in FIG. 5. Then, the two grasping fingers 370 are closed so that as shown in FIGS. 5 and 7, the two engaging portions 444 sandwich the seat portion 222 and thereby grasp the pin 212. Although the pin holder 368 grasps the pin 212 at the position adjacent thereto on the side of the storing device 340 in the X-axis direction, the pin 212 should have no other pins 212 on this side, i.e., a vacant space on this side, because the pins 212 are stored in the order reverse to the order of setting of the pins 212. Therefore, the pin holder 368 can grasp the pin 212 while the bracket 348, the piston rod 402, etc. are prevented from interfering with the other pins 212.

After the two grasping fingers 370 grasp the supporting pin 212, the control goes to S6 where the pin holder 368, positioned at its downward-movement-end position, is moved by the X-Y robot 48. Thus, the supporting pin 212 being held in contact with the first supporting surface 214 by the magnetic force applied thereto, receives a force in a direction perpendicular to the axis line of the pin 212 and parallel to the first and second supporting surfaces 214, 344. Since the bottom surface 236 of the supporting pin 212, and the first and second supporting surfaces 214, 344 are all plane surfaces, this force causes the supporting pin 212 to move relative to the first and second supporting surfaces 214, 244, i.e., slide on the same 214, 244. At this time, the supporting pin 212 also receives a force equal to the product of the magnetic force and a friction coefficient with respect to the first supporting surface 214 and the bottom surface 236 of the pin 212, in a direction opposite to the direction in which the pin 212 is moved by the X-Y robot 48. If this resistance force is overcome by the force applied to the supporting pin 212 by the pin holder 368, the pin 212 is moved or slid on the first supporting surface 214. Since the first and second supporting surfaces 214, 344 of the first and second supporting tables 210, 342 are kept substantially continuous with each other while a resetting operation is performed, the pin 212 transfers from the first surface 214 to the second surface 344, so that the pin 212 is moved to the storing position having the storing address Ns.

During this movement, the pin holder 368 is rotated by 180 degrees, so that the two grasping fingers 370 are positioned, relative to the supporting pin 212 grasped thereby, on the side of the first supporting table 210 as seen in the X-axis direction. This rotation is effected in a state in which the pin holder 368 has been moved to such a position where there is no possibility that the pin holder 368 may possibly interfere with the other pins 212 than the pin 212 grasped thereby. Since the supporting pins 212 are returned to the storing device 340 in the order reverse to the order in which the pins 212 are taken out of the storing device 340, that is, the earlier pins 212 are stored at the remoter storing positions in the storing device 340 from the first supporting table 210, i.e., the storing positions having the greater storing addresses, the current storing address where the current pin 212 is to be stored has a vacant space on the side of the first supporting table 210 as seen in the X-axis direction. Thus, the current pin 212 can be stored at the current storing position, without the problem that the bracket 348, the piston rod 402, etc. may possibly interfere with the other pins 212. After this movement, the control goes to S7 where the supporting pin 212 is stored. More specifically described, the two grasping fingers 370 are opened to release the pin 212, and are moved away from the pin 212 in the X-axis direction, so that the pin 212 is seen to come out of the fingers 370 in a state in which the pin 212 is magnetically fixed to the second supporting table 342.

After the supporting pins 212 is stored, the control goes to S8 to judge whether the storing operation has been finished, i.e., whether all the supporting pins 212 set on the first supporting table 210 have been stored in the storing device 340. This judgment may be made by judging whether the pin number n is equal to one. At S8, a negative judgment is made before all the pins 212 have been stored in the storing device 340. In this case, the control goes to S9 to decrement the pin number pn and the storing address Ns, each by one, and then goes back to S3. S3 to S9 are repeated till all the pins 212 set on the first supporting table 210 are stored in the storing device 340.

When all the supporting pins 212 have been returned to the storing device 340, a positive judgment is made at S8, and the control goes to S10 where the pin holder 368 is moved upward to its upward-movement-end position. Thus, the pin storing routine is finished. Since the resetting command is present, the pin-storing routine is followed by the pin-setting routine to attach supporting pins 212 to the first supporting table 210. At S21 of the pin-setting routine, the pin number np and the pin-storing address Ns are initialized. More specifically described, the pin number np is initialized to one, and the pin-storing address Ns is initialized to the smallest address defining the lower limit of the address range in which the supporting pins 212 are stored in the storing device 340. Then, at S22, the pin holder 368 is moved downward to its downward-movement-end position, and then, at S23, information relating the supporting pin 212 having the pin number np is obtained from the pin-setting information. Subsequently, at S24, the pin holder 368 is moved to the storing position having the pin-storing address Ns. During this movement, the pin holder 368 is rotated, so that the two grasping fingers 370 are positioned, relative to the pin 212 to be taken out of the storing device 340, on the side of the first supporting table 210 as seen in the X-axis direction.

After the above movement, the control goes to S25 where the pin holder 368 grasps the supporting pin 212. Normally, the two grasping fingers 370 are opened. After the pin holder 368 is moved to the pin 212 so that the pin 212 is positioned between the two fingers 370, the two fingers 370 are closed to grasp the seat portion 222 of the pin 212. After this grasping, the control goes to S26 where the pin holder 368, positioned at its downward-movement-end position, is moved by the X-Y robot 48 to the first supporting table 210. In the state in which the supporting pin 212 is magnetically held in contact with the second supporting surface 344 and then the first supporting surface 214, the pin 212 is moved or slid on the second and first surfaces 344, 214, is transferred from the second surface 344 to first surface 214, and finally is positioned at the setting position represented by the pin-setting information. During this movement, the pin holder 368 is rotated by 180 degrees, so that the pin holder 368 is positioned, relative to the pin 212 grasped thereby, on the side of the storing device 340 in the X-axis direction. Thus, the bracket 438 and others are prevented from interfering with the other pins 212. After this movement, the control goes to S27 where the supporting pin 212 is set on the first supporting table 210. The two grasping fingers 370 are opened to release the pin 212, and are moved away from the pin 212, which is magnetically fixed to the first supporting table 210.

After the supporting pin 212 is set on the first supporting table 210, the control goes to S28 to judge whether all the supporting pins 212 to be set have been set. This judgment may be made by judging whether the pin number np is equal to $np_{max}$. If a negative judgment is made at S28, then the control goes to S29 to increment the pin number pn and the pin-storing address Ns, each by one, and then goes back to S23. S23 to S29 are repeated till all the pins 212 are set on the first supporting table 210. When all the supporting pins 212 have been set on the first supporting table 210, a positive judgment is made at S28, and the control goes to S30 where the pin holder 368 is moved upward to its upward-movement-end position. Thus, the pin-setting routine is finished.

After the resetting operation is finished, the movable rail 190 is moved to change the PWB-convey width of the PWB conveyor 22 to an appropriate width corresponding to the new sort of PWBs. Some supporting pins 212 may be left in an area on the first supporting surface 214 that is located, in the Y-axis direction, outside (i.e., on the movable-rail side of) an area of the surface 214 corresponding to the PWB 24 for which an operation is to be performed. Even if the movable rail 190 may collide with those pins 212, the pins 212 are fell down by a force applied thereto by the movable rail 190 in a direction perpendicular to the respective axis lines of the pins 212. Thus, the movable rail 190 is allowed to move, and the rail 190 and the pins 212 are prevented from being damaged. In addition, since the width of the second supporting table 342 is somewhat shorter than the shortest distance of the fixed and movable rails 188, 190, the movable rail 190 does not interfere with the supporting pins 212 fixed to the second supporting table 342.

As is apparent from the foregoing description of the present embodiment, the resetting of the PWB supporting device 174 is automatically performed without needing any interventions of the operator, and accordingly the resetting operation is performed at an increased speed. In addition, since each supporting pin 212 is moved by being slid on the first and second supporting surfaces 214, 344, the each pin 212 can be moved with a smaller force than a force which would be applied to the each pin 212 in a direction parallel to the axis line of the each pin 212 and would be needed to pull the each pin 212 apart from the first or second supporting surface 214, 344. Moreover, since a kinetic friction coefficient is smaller than a static friction coefficient, some impact is produced when each supporting pin 212 starts moving. However, this impact is smaller than an impact which would be produced when the each pin 212 is pulled apart from the first or second supporting surface 214, 344. Thus, each supporting pin 212 can be moved with a small force, while being attracted to the first or second supporting surface 214, 344 by a sufficiently great magnetic force. In addition, each supporting pin 212 can be moved with only small vibration, impact, or noise being produced from the first or second supporting table 210, 342, the X-Y robot 48, etc. The PWB supporting device 174 can be reset with these advantages.

It emerges from the foregoing description of the present embodiment that the X-Y robot 48 provides a supporting-member moving device which moves each supporting member 212; and this supporting-member moving device moves the EC mounting head 30 in directions parallel to the first supporting surface 124. Thus, the supporting-member moving device provides part of an operation-relating moving device which moves the EC mounting head 30 relative to the PWB 24 supported by the PWB supporting device 174.

Figure 16:
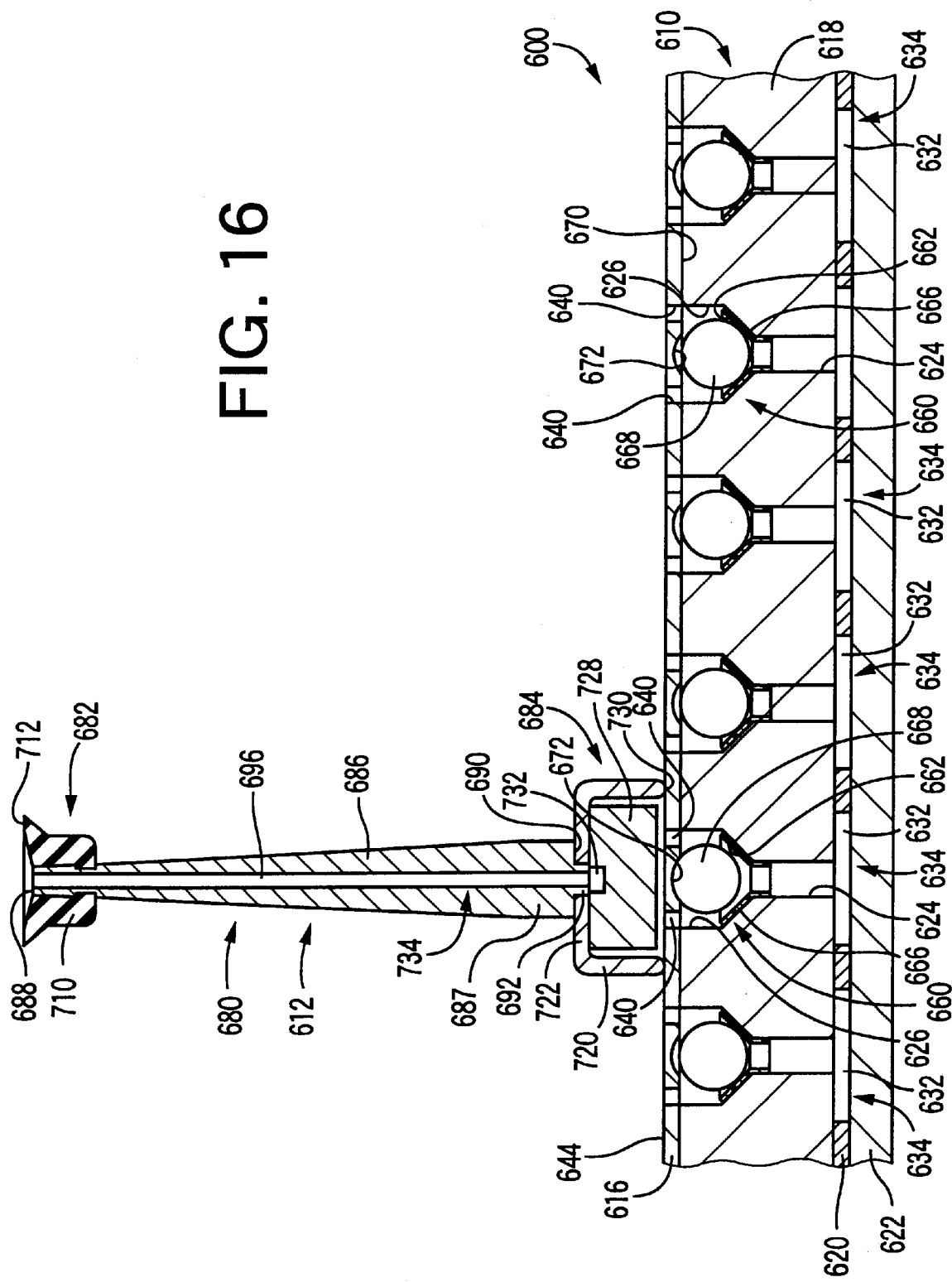
FIG. 16 is a cross-sectioned, front elevation view of a portion of a PWB holding device of another EC mounting system as another embodiment of the present invention.

The supporting members 212 may be replaced with holding members each of which applies negative pressure to a PWB 24 and thereby holds and supports the same 24, as illustrated in another embodiment shown in FIG. 16. The same names and numerals as used in the first embodiment shown in FIGS. 1 to 15 are used to designate the corresponding elements of the second embodiment shown in FIG. 16.

In the second embodiment, a PWB holding device 600 as a PWB supporting device is provided on a PWB lifter 176, like the previously-described PWB supporting device 174. As shown in FIG. 16, the PWB holding apparatus 600 includes a holding table 610 as a first supporting table, and a plurality of holding pins 612 each as a sort of holding member as a supporting member that are attachable to the holding table 610. The holding table 610 includes a coming-off preventing plate 616, a base 618, a spacer 620, and a cover 622 which are superposed on one another. The base 618 as a main member of the holding table 610 has a plate-like configuration, and is formed of a non-magnetic material such as aluminum. The base 618 has a plurality of negative-pressure-supply holes 624 each of which is formed through the thickness thereof and opens in each of the upper and lower surfaces thereof. Each supply hole 624 is a stepped hole including a small-diameter portion on the side of the spacer 620 and a large-diameter portion on the side of the coming-off preventing plate 616. The large-diameter portion of each supply hole 624 provides a valve hole 626.

The spacer 620 has a thin-plate-like configuration having a plurality of openings 632 which are formed through the thickness thereof in respective portions thereof corresponding to the respective negative-pressure-supply holes 624 of the base 618. The cover 622 also has a plate-like configuration and cooperates with the base 618 to sandwich the spacer 620, so that opposite ends of each of the openings 632 of the spacer 620 are closed to provide a communication passage 634.

The cover 622 has a plurality of communication holes (not shown) which are formed through the thickness thereof and communicate with the respective communication passages 634 of the spacer 620. The holding table 610 is fixed to the PWB lifter 176 by a fixing device, not shown, and, in this state, the communication holes of the cover 622 are connected to respective passages, not shown, formed in the lifter 176, and are eventually connected to a negative-pressure supply source 70 via those passages. Between those passages and the supply source 70, there is provided a switch-valve device, not shown, which is switchable to selectively communicate the supply holes 624 with the supply source 70 or the atmosphere.

In the present embodiment, the coming-off preventing plate 616 is formed of a ferromagnetic material such as steel, has a thin-plate-like configuration, and is superposed on the upper surface of the base 618. In the present embodiment, the preventing plate 616 has substantially the same size as that of the base 618, and accordingly covers all the valve holes 626 of the base 618. The preventing plate 616, the base 618, the spacer 620, and the cover 622 are fixed to one another in such a manner that respective outer peripheral portions of the elements 616, 618, 620, 622, free of the communication passages 634, are fixed to one another by a fixing device such as bolts, not shown. The thus fixed elements 616, 618, 620, 622 function as the integral holding table 610.

Each of respective portions of the coming-off preventing plate 616 that correspond to the valve holes 626 of the base 618 has a plurality of communication holes 240 at respective positions offset from the centerline of the corresponding valve hole 626. Those communication holes 640 are located along a circle whose center coincides with the centerline of the valve hole 626, such that the communication holes 640 are equiangularly spaced from each other about the center of the circle. Each communication hole 640 has a circular cross section, and has a diameter smaller than that of the valve hole 626. Thus, it can be said that the coming-off preventing plate 616 is equivalent to a plurality of closing members which are fitted in the respective upper openings of the negative-pressure-supply holes 624 to close the supply holes 624 and which are integrated with each other. The supply holes 624 open in an upper surface of the preventing plate 616 that defines an upper surface of the holding table 610, i.e., a supporting surface 644 as a first supporting surface. Since the preventing plate 616 is formed of ferromagnetic material, the holding surface 644 has the properties of ferromagnetic material.

The base 618, the spacer 620, and the cover 622 have a high degree of planeness or flatness like those employed in a PWB holding device disclosed in Japanese Patent Document No. 7-15189. Similarly, the coming-off preventing plate 616 has a high degree of flatness. In the present embodiment, the holding surface 644 of the holding table 610 is horizontal and enjoys a high degree of flatness.

An open-and-close valve 660 is provided in each of the negative-pressure-supply holes 624. A bottom surface of the valve hole 626, located between the large-diameter and small-diameter portions of the each supply hole 624, is tapered such that the diameter of the tapered bottom surface gradually decreases in a direction toward the small-diameter portion, i.e., in a downward direction. The tapered bottom surface provides an upward facing valve seat 662. Each of the valve seats 662 is covered by a pad 666 which is formed of a synthetic resin. A spherical ball 668 as a valve member is provided in each of the valve holes 626. The ball 668 has a diameter smaller than that of the valve hole 626, and is movable in the valve hole 626. In the present embodiment, the ball 668 is formed of a ferromagnetic material such as steel. The coming-off preventing plate 616 has, in respective portions of a lower surface 670 (i.e., a surface on the side of the valve holes 626), respective positioning recesses 672 which correspond to the respective valve holes 626 and each of which is located inside the communication holes 640. Each positioning recess 672 has a part-spherical inner surface corresponding to an outer spherical surface of each ball 668.

Next, the holding pins 612 will be described.

Each holding pin 612 includes a pin portion 680, a cup portion 782, and a seat portion 684. A pin 686 functioning as the pin portion 680 has a circular cross section, and include, at one end portion thereof (i.e., a lower end portion thereof), a engageable portion 687 which has a cylindrical shape having a constant diameter. The diameter of the pin 686 decreases from the engageable portion 687 to the other end portion of the pin 686. A free or upper end surface of the pin 886 provides a horizontal PWB-support surface 688 (hereinafter, referred to as the support surface 688). The pin 686 has, at the center of a lower surface 690 thereof, a projection 692 having a circular cross section, and additionally has a passage 696 which is formed therethrough in an axial direction thereof and opens in each of the support surface 688 and an end surface of the projection 692.

A suction cup 710 fits on an upper end portion of the pin portion 680, such that the suction cup 710 is detachable from the pin portion 680 but is not easily pulled off the same 680. The suction cup 710 provides the cup portion 682. In the present embodiment, the suction cup 710 is formed of rubber, and has a diameter greater than that of the support surface 688. An upper portion of the cup 710 projects upward from the support surface 688, and an upper surface of the cup 710 provides a contact surface 712 which has an annular shape whose diameter is greater than that of the support surface 688, and which faces upward.

A seat member 720 as an attached member is fixed to a lower end portion of the pin 686 that is located on the side of the engageable portion 687. The seat member 720 has an container-like shape having a circular cross section. An inner diameter of the seat member 720 is somewhat greater than that of each valve hole 626. Therefore, in a state in which each holding pin 612 is set on the holding surface 644 such that the seat member 720 thereof covers one negative-pressure-supply hole 624 and the pin 686 thereof is offset by the greatest amount from the one supply hole 624, the seat member 720 does not cover any portions of other supply holes 624 adjacent to the one supply hole 624 covered by the same 720. In addition, in a state in which the holding pins 612 are attached to the supply holes 624 such that the holding pins 612 are coaxial with the corresponding supplying holes 624, small spaces are left among the respective seat members 720 of the holding pins 612 and accordingly the holding pins 612 do not interfere with each other. Thus, the seat member 720 of each holding pin 612 is prevented from covering any portion of the other supply hole 624 than the supply hole 624 to be covered by the pin 612, or opening the corresponding open-and-close valve 660.

The projection 692 of the pin 686 is externally fitted in a middle portion of a top wall 722 of the seat member 720, and is fixed to the wall 722 by an appropriate fixing means such as brazing. Thus, the seat member 720 has an opening on one side thereof opposite to the other side thereof on which the pin 686 is present. A permanent magnet 728 is fixed to the seat member 720, and cooperates with the seat member 720 to provide the seat portion 684. The permanent magnet 728 has a cylindrical shape that is somewhat smaller than an inner space of the seat member 720. A lower end portion of the seat member 720 projects downward from the permanent magnet 728, and a lower end surface of the seat member 720 provides a bottom surface 730 of the seat portion 684. The permanent magnet 728 has a passage 732 which opens in the passage 696 and is diametrically formed through the magnet 728. Thus, the passage 696 is communicated with a space left between the seat member 720 and the magnet 728. The passages 696, 732 and the space left between the seat member 720 and the magnet 728 cooperate with each other to provide a negative-pressure passage 734 which opens in the support surface 688 and the bottom surface 730.

In the present embodiment, a plurality of holding pins 612 are stored in a pin-storing device. Since, however, the pin-storing device is identical with the storing device 340 employed in the first embodiment, the illustration and description thereof are omitted.

In the PWB holding device 600 constructed as described above, with respect to a negative-pressure-supply hole 624 to which a holding pin 612 is not attached, the ball 668 is seated, owing to its own weight, on the valve seat 662 and closes the open-and-close valve 660. On the other hand, with respect to a negative-pressure-supply hole 624 to which a holding pin 612 is attached, the bottom surface 730 of the holding pin 612 is closely contacted with a portion of the holding surface 644 of the holding table 610 that surrounds the opening of the hole 624, and thereby covers the opening of the hole 624. Since the permanent magnet 728 is fixed to the seat member 720 and the coming-off preventing plate 616 is formed of ferromagnetic material, the plate 616 is magnetized and accordingly the holding pin 612 is attracted and fixed to the holding table 610 by the magnetic force. Since the permanent magnet 728 is located inward of the bottom surface 730 of the seat member 720, the bottom surface 730 is closely contacted with the holding surface 644 to prevent leakage of the negative pressure.

Since the ball 668 as the valve member of the open-and-close valve 660 is formed of steel and the base 618 in which the valve seat 662 is provided is formed of aluminum, the ball 668 is magnetized by the permanent magnet 728, but the valve seat 662 is not magnetized, so that the ball 668 is magnetically attracted by the coming-off preventing plate 616 and is moved away from the valve seat 662 and accordingly the open-and-close valve 660 is opened. Thus, the negative-pressure passage 734 is communicated with the negative-pressure-supply hole 624 via the communication holes 640. The preventing plate 616 prevents the ball 668 from coming off the valve hole 626. In addition, the ball 668 is partly accommodated in the positioning recess 772 formed in the preventing plate 616, and accordingly is positioned relative to the communication holes 640 in directions intersecting the directions in which the ball 668 is moved toward, and away from, the valve seat 662. Thus, the communication holes 640 are not closed by the ball 668, and accordingly the communication between the negative-pressure passage 734 and the negative-pressure supply hole 624 is maintained. In this state, the supply hole 624 is communicated with the passage 734 via the valve hole 726, and the communication holes 640 of the plate 616, so that the passage 734 is supplied with the negative pressure from the supply hole 624.

When the ECs 32 are mounted on the PWB 24, the PWB 24 is carried in by the PWB conveyor 22. At this time, the PWB holding device 600 is held at its downward-movement-end position by a PWB elevating and lowering device 170, so that the PWB 24 is carried in onto the PWB holding device 600, and contacted with, and stopped by, the stopper, not shown. Then, the PWB holding device 600 is moved upward to its upward-movement-end position by the elevating and lowering device 170. When the PWB lifter 176 is moved upward, the solenoid-operated direction-switch valve, not shown, is switched to communicate the negative-pressure-supply holes 624 with the negative-pressure source 70, so that the negative pressure is supplied to the holding pins 612. Thus, the holding pins 612 are moved upward while sucking and holding the PWB 24. Eventually, the holding pins 612 lift up the PWB 24 off the conveyor belts 192, and press the same 24 against the PWB hold-down portions 194. In the present embodiment, the distance of movement of the PWB holding device 600 is equal to a value which is obtained by subtracting the thickness of the PWB 24 from the distance between the hold-down portions 194 and the support surfaces 688 of the holding pins 612 positioned at their downward-movement-end position. The suction cups 710 are elastically deformed while sucking and holding the PWB 24. In the state in which the PWB holding device 600 is positioned at its upward-movement-end position, the support surfaces 688 engage the PWB 24, and support the lower surface 215 of the PWB 24. Even if the PWB 24 may warp such that the PWB 24 is upwardly convex, the convex warpage of the PWB 24 is sucked by the holding pins 612 and is closely contacted with the support surfaces 688, so that the PWB 24 is corrected to extend along a plane. Thus, the PWB holding device 600 holds the PWB 24 such that the PWB 24 takes a horizontal posture. The clamping plates cooperate with the hold-down portions 194 to sandwich the opposite end portions of the PWB 24, and thereby fix the same 24, like in the first embodiment.

During the time duration in which the ECs 32 are mounted on the PWB 24, the negative pressure is continuously supplied to the holding pins 612. Consequently the PWB 24 is sucked and held by the holding pins 612 and is kept horizontal, and the balls 668 of the open-and-close valves 660 present in the negative-pressure-supply holes 624 free of the holding pins 624 are seated, owing to their own weights, on the corresponding valve seats 662 and are pressed against the same 662 by the attractive forces applied thereto owing to the negative pressure. Since the valve seats 662 are covered by the pads 666, the pads 666 are deformed and are closely contacted with the balls 668, so that the negative-pressure-supply holes 624 are closed by the balls 668 and the leakage of the negative pressure is more effectively prevented.

After the ECs 32 are mounted on the PWB 24, the clamping plates are moved downward to release the PWB 24, and the PWB holding device 600 is moved downward to its downward-movement-end position. At this time, the negative pressure is stopped and is not supplied to the negative-pressure-supply holes 624, so that the holding pins 612 do not any longer hold the PWB 24. When the lower surface 215 of the PWB 24 is supported on the conveyor belts 192, the holding pins 212 are separated from the PWB 24. Then, the PWB 24 is carried out by the PWB conveyor 22, and the next PWB 24 is carried in so that ECs 32 are mounted on the next PWB 24.

When the current sort of PWBs 24 are changed to a new sort of PWBs 24 on each of which ECs 32 are to be mounted, the PWB holding device 600 is automatically reset in the same manner as that employed in the first embodiment. In order to perform the resetting operation, pin-setting information and pin-storing information are prescribed in the same manner as that employed in the first embodiment. The pin-setting information includes data representing the total number of holding pins 612 to be set on the holding table 610, and setting-position data representing respective setting positions where the holding pins 612 are to be set on the holding surface 644 of the holding table 610.

Respective horizontal-direction positions as the respective setting positions, of the holding pins 612 are so determined as to satisfy both a first condition prescribed for the PWB 24 and a second condition prescribed for the PWB holding device 600. The first condition is the same as that employed in the first embodiment. The second condition is that the seat members 720 of the holding pins 612 do not interfere with each other, and closely contact the respective portions of the holding surface 644 that surround the respective openings of the negative-pressure-supply holes 624, so as to cover completely the respective holes 624. The respective horizontal-direction positions of the holding pins 612 are so determined automatically, or by an operator, as to satisfy both the condition prescribed for the PWB 24 and the condition prescribed for the PWB holding device 600. The pin-storing information is prescribed in the same manner as that employed in the first embodiment.

When the PWB holding device 600 is reset, the pin holder 368 grasping each holding pin 612 moves or slides the each pin 612 on the holding surface 644 of the holding table 610 and the second supporting surface 344 of the storing device 340, so that the each pin 612 is stored at a prescribed storing position in the storing device 340. After all the holding pins 612 are stored in the storing device 340, appropriate holding pins 612 stored in the storing device 340 are set on the holding table 610. The pin holder 368 grasping each holding pin 612 moves or slides the each pin 612 on the second supporting surface 344 and then the holding surface 644, so that the each pin 612 is set at a prescribed storing position on the holding surface 644 such that the each pin 612 covers one negative-pressure-supply hole 624. However, since each holding pin 612 includes the seat member 720, the pin holder 368 grasps the easily engageable portion 687 as a portion of the pin 686 that is located on the side of the seat member 720. Alternatively, the pin holder 368 may be modified to grasp the seat member 368 of each holding member 612.

In the present embodiment, the seat member 368 of each holding pin 612 has a circular cross section whose diameter is somewhat greater than that of each negative-pressure-supply hole 624. Thus, each holding pin 612 must be positioned relative to one supply hole 624, with a smaller permissible positional error than that with which a holding pin including an elongate seat member, described below, must be positioned relative to a supply hole 624. In the present embodiment, therefore, in order to increase the probability that each holding pin 612 can be engaged with an engageable portion of the PWB 24 and simultaneously can be attached to the holding table 610, the holding table 610 has a greater number of negative-pressure-supply holes 624, as compared with a holding table to which holding pins each including an elongate seat member are attached. Meanwhile, in the present embodiment, all the negative-pressure-supply holes 624 are provided with the open-and-close valves 660, respectively, and the valves 660 for the supply holes 624 free of the holding pins 612 remain closed to prevent the leakage of negative pressure. Thus, it is not needed to close, with closing members, the supply holes 624 free of the holding pins 612 SO as to prevent the leakage of negative pressure. Thus, even if the holding table 610 has the great number of negative-pressure-supply holes 624, the time needed to perform the resetting operation is not increased.

In the second embodiment, shown in FIG. 16, in which the PWB 24 is sucked and held by the holding pins 612, the negative-pressure-supply holes 624 are provided with the open-and-close valves 660, respectively. However, it is possible to omit the open-and-close valves 660 and close, with closing members, the supply holes 624 free of the holding pins 612 so as to prevent the leakage of negative pressure, as will be illustrated in a third embodiment shown in FIGS. 17 to 21. The same names and numerals as used in the preceding embodiments are used to designate the corresponding elements of the third embodiment.

Figure 17:
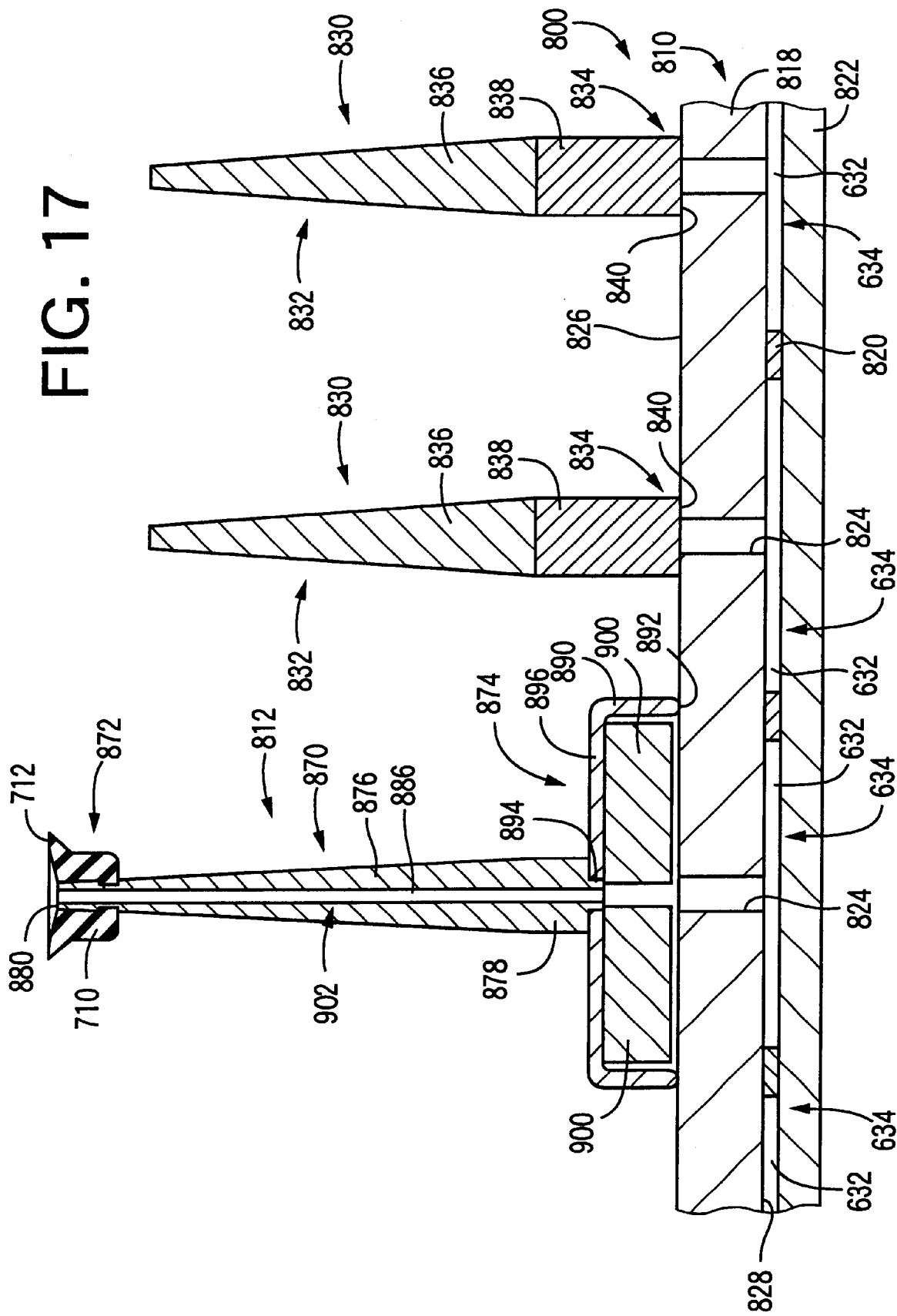
FIG. 17 is a cross-sectioned, front elevation view of a portion of a PWB holding device of yet another EC mounting system as another embodiment of the present invention.

As shown in FIG. 17, a PWB holding device 800 employed in the third embodiment includes a holding table 810 as a first supporting table, and a plurality of holding pins 812 each as a sort of holding member as a supporting member that are attachable to the holding table 810. The holding table 810 includes a base 818, a spacer 820, and a cover 822 which are superposed on one another. The base 818 as a main member of the holding table 810 has a plate-like shape, and is formed of a ferromagnetic material such as steel. The base 818 has a plurality of negative-pressure-supply holes 824 which are formed through the thickness thereof. Each of the holes 824 opens in an upper surface of the base 818, i.e., a holding surface 826 as a first supporting surface, on which the holding pins 812 are to be set, and a lower surface 828 of the same 818 on which the spacer 820 is superposed. The supply holes 824 are provided at lattice points, respectively. Since the remaining features of the holding table 810 are the same as those of the holding table 710 employed in the second embodiment, the same reference numerals as used in the second embodiment are used to designate the corresponding elements of the third embodiment, and the description thereof is omitted.

Figure 19:
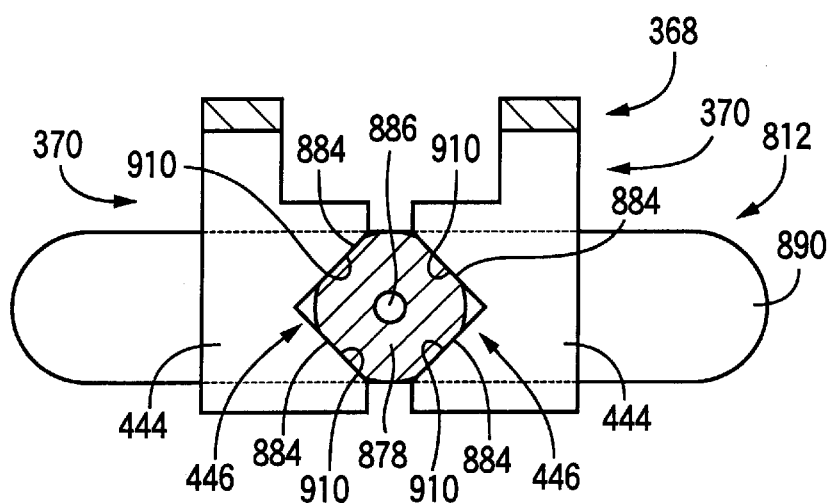
FIG. 19 is a cross-sectioned, plan view showing a state in which a holding pin shown in FIG. 17 is held by a pin holder.
Figure 20:
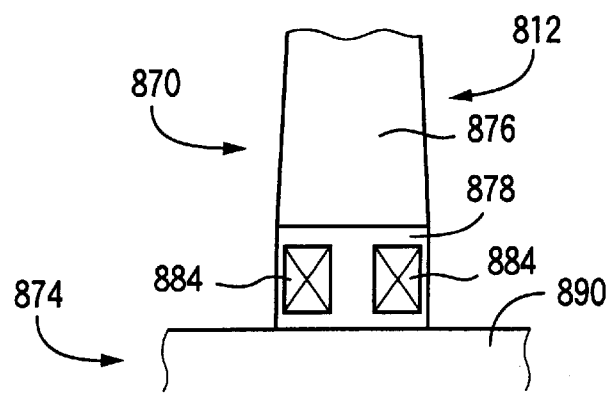
FIG. 20 is a front elevation view of an engageable portion of the holding pin of FIG. 17.

Each holding pin 812 includes a pin portion 870, a cup portion 872, and a seat portion 874. A pin 876 functioning as the pin portion 870 of the holding pin 812 has a circular cross section, and one end portion of the pin 876 provides an engageable portion 878 having a constant diameter. The remaining portion of the pin 876 is tapered such that its diameter decreases toward its free end. A free end surface of the pin 876 provides a PWB support surface 880 (hereinafter, referred to as the support surface 880). As shown in FIGS. 19 and 20, the engageable portion 878 has four chamfers which are equiangularly spaced from each other and provide four planar engageable surfaces 884. The pin 876 has an inner passage 886 which extends along a lengthwise axis line thereof through a thickness thereof. The cup portion 872 has a structure similar to that of the cup portion 682 of each holding pin 612 employed in the second embodiment. The same numerals as used in the second embodiment are used to designate the corresponding elements of each holding pin 812 employed in the third embodiment.

Figure 18:
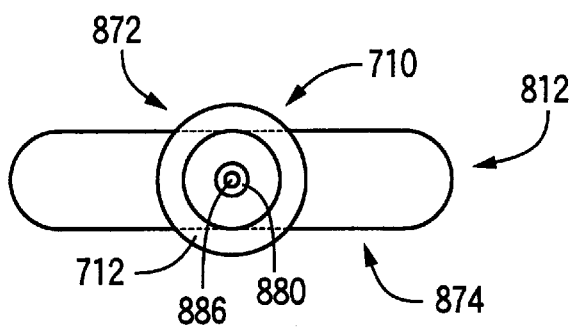
FIG. 18 is a plan view of a holding pin as part of the PWB holding device of FIG. 17.

A seat member 890 is fixed to one end portion of the pin 876 as part of the pin portion 870 that is located on the side of the engageable portion 878. As shown in FIGS. 17 and 18, the seat member 890 has an elongate container-like shape, and a width of an inner space of the seat member 890 is somewhat greater than the diameter of each negative-pressure-supply hole 824 and a length of the inner space is not less than two times greater than the width thereof. An end surface of the seat member 890 provides an annular seat surface 892 which extends parallel to the support surface 880 and which closely contacts the holding table 810. The A projection 894 of the pin 876 externally fits in a lengthwise middle portion of an upper wall 892 of the seat member 890, such that the pin 876 extends perpendicularly to the seat surface 892, and is fixed to the wall 896 by an appropriate fixing means or manner, such as brazing. The inner passage 886 of the pin 876 is communicated with the inner space of the seat member 890.

A plurality of permanent magnets 900, e.g., two permanent magnets 900 in the present embodiment, are provided in the inner space of the seat member 890, such that the permanent magnets 900 are fixed to respective portions of the wall 896 on both sides of the passage 886. Thus, the permanent magnets 900 and the seat member 890 cooperate with each other to provide the seat portion 874. Each of the permanent magnets 900 has a rectangular parallelepiped shape, and has a thickness and a width somewhat smaller than a depth and a width of the seat member 890, respectively, so that the each magnet 900 is located somewhat inward of the seat surface 892. The passage 886, and small clearances left between the permanent magnets 900 and side walls of the seat member 890 cooperate with each other to provide a negative-pressure passage 902 which extends from the seat surface 892 of the holding pin 812 to the opposite, support surface 880 thereof, through the entire length thereof. As shown in FIG. 19, the four engageable surfaces 884 of the pin 896 are inclined relative to each of the lengthwise and widthwise directions of the seat member 890.

The holding pins 812 are not attached to all of the negative-pressure-supply holes 824 of the holding table 810, i.e., are attached to only some of the supply holes 824. The other supply holes 824 to which the holding pins 812 are not attached are closed by closing pins 830 each as a closing member. Each closing pin 830 includes a pin portion 832 and a closing portion 834, and has such a height which assures that when the PWB holding device 800 holds a PWB 24, the each closing pin 330 does not interfere with ECs 32 mounted on the back surface 215 of the PWB 24 or uneven portions of the same 215. The pin portion 832 is provided by a pin 836 which has a circular cross section and whose diameter decreases in a direction toward a free end surface thereof. The closing portion 834 is provided by a permanent magnet 838 which is fixed to a lower end of the pin 836 that has the greatest diameter. In the present embodiment, the permanent magnet 838 has an elongate cylindrical shape whose diameter is greater than that of each negative-pressure-supply hole 824 and is equal to that of the engageable portion 878 of each holding pin 812. Each closing pin 830 has a bottom surface 840 which is defined by an end surface of the closing portion 834 and which is seated on the holding surface 826 of the holding table 810.

Figure 21:
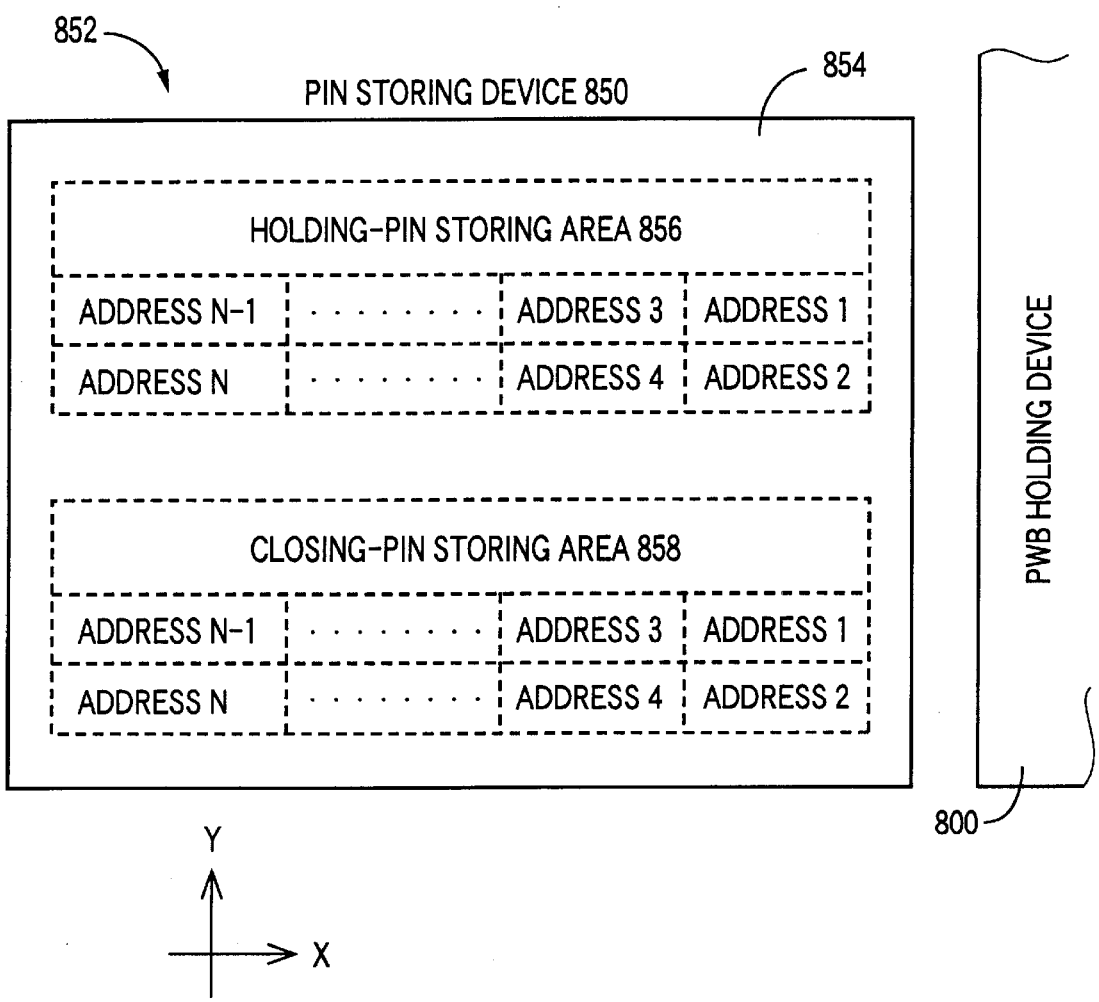
FIG. 21 is a view for explaining a manner in which the holding pins and the closing pins shown in FIG. 17 are stored in a storing device.

As schematically shown in FIG. 21, a pin-storing device 850 (hereinafter, referred to as the storing device 850) is provided adjacent to the PWB holding device 800. The storing device 850 stores a plurality of holding pins 812 and a plurality of closing pins 830. The storing device 850 includes a supporting table 852 as a second supporting table that is formed of steel as a ferromagnetic material, and an upward facing, horizontal surface of the supporting table 852 that is formed of the ferromagnetic material provides a supporting surface 854, like the storing device 340 employed in the preceding embodiments. The supporting surface 854 includes a holding-pin storing area 856 which stores a plurality of holding pins 812, and a closing-pin storing area 858 which stores a plurality of closing pins 830. A portion of the supporting surface 854 that defines the closing-pin storing area 858 functions as a third supporting surface which is substantially continuous with the holding surface 826 on a common horizontal plane in a state in which the PWB holding device 800 is positioned at its downward-movement-end position; and a portion of the supporting table 852 that defines the third supporting surface functions as a third supporting table. Thus, in the present embodiment, the third supporting table is provided by the supporting table 852. In the present embodiment, the two areas 856, 858 are arranged in the Y-axis direction, and each area is adjacent to the PWB holding device 800 in the X-axis direction. The holding-pin storing area 856 has a plurality of prescribed storing positions at each of which a holding pin 812 is stored; and the closing-pin storing area 858 has a plurality of prescribed storing positions at each of which a closing pin 830 is stored. The respective storing positions of the two areas 856, 858 have respective addresses. In the present embodiment, each holding pin 812 is stored in such a state that the pin 812 is positioned at a prescribed angular phase or rotation position in which the lengthwise direction of the seat member 890 thereof is parallel to the Y-axis direction.

In the PWB holding device 800 constructed as described above, each holding pin 812 and each closing pin 830 are magnetically attracted an fixed to the holding table 810, so that the seat member 890 of each holding pin 812 covers one negative-pressure-supply hole 824 and the negative-pressure passage 902 is communicated with the supply hole 824, so as to apply negative pressure to the PWB 24, attract the same 24 to the support surface 880, and support the same 24. Each closing pin 830 is set on the holding table 810, such that the bottom surface 840 thereof is seated on the holding surface 826 so as to cover one supply hole 824 to which a holding pin 812 is not attached, and thereby prevent the leakage of negative pressure.

When the current sort of PWBs 24 are changed to a new sort of PWBs 24 on each of which ECs 32 are to be mounted, the PWB holding device 800 is automatically reset. In order to perform the resetting operation, pin-setting information and pin-storing information are prescribed in the same manner as that employed in the first embodiment. The pin-setting information includes data representing the total number of holding pins 812 and the closing pins 830 to be set on the holding table 810. For each holding pin 812, in particular, the pin-setting information additionally includes data representing the sort of the each pin 812 (i.e., the fact that the each pin 812 is not a closing pin 830 but a holding pin 812); setting-position data representing a setting position where the each pin 812 is to be set on the holding surface 826 of the holding table 810; and rotation-position data representing a rotation position at which the each pin 812 is to be mounted on the holding surface 826. The rotation position defines a direction in which the elongate seat member 890 thereof extends. For example, the rotation-position data represents an angle of the lengthwise direction of the seat member 890 of each holding pin 812 with respect to the X-axis direction. The pin-setting information includes, for each closing pin 830, setting-position data representing a setting position where the each pin 830 is to be set on the holding surface 826.

The above-described setting positions and rotation position are so determined as to satisfy both a first condition prescribed for the PWB 24 and a second condition prescribed for the PWB holding device 800. The first condition is the same as that employed in each of the preceding embodiments. The second condition is, for each holding pin 812, such that the seat member 890 of each holding pin 812 does not interfere with the seat members 890 of the other holding 812, or the closing pins 830, and closely contacts a portion of the holding surface 826 that surrounds the opening of one negative-pressure-supply hole 824, so as to cover completely the opening of the supply hole 824, i.e., so as not to cover only a portion of the opening. For each closing pin 830, the second condition is such that the each pin 830 completely covers one supply hole 824 to which a holding pin 812 is not attached.

Since the seat member 890 of each holding pin 812 is elongate and the pin 876 thereof is connected to the lengthwise middle portion of the seat member 820, the pin 876 can be positioned, on the holding table 810, at an arbitrary position within a circle whose radius is equal to the distance between the central axis of the pin 876 and the center of the supply hole 824 and whose center coincides with the center of the supply hole 824. The distance between the central axis of the pin 876 and the center of the supply hole 824 takes a maximal value when the hole 824 is aligned with one of opposite end portions of the seat member 820. Therefore, the pin 876 can be positioned at an arbitrary position within a circle whose radius is equal to the maximal value. In the present embodiment, the respective circles associated with the plurality of negative-pressure-supply holes 824 overlap each other to cover substantially entirely the holding surface 826 of the holding table 810. Thus, the pin 876 of each holding pin 812 can be positioned at an arbitrary position on the holding surface 826 of the holding table 810. However, in the case where a plurality of holding pins 812 are set on the holding table 810, the respective seat members 890 of the holding pins 812, and the closing pins 830 must not interfere with one another. This limits the respective setting positions where the holding pins 812 are set on the holding table 810.

Thus, respective horizontal-direction positions and rotation positions of the holding pins 812, and respective horizontal-direction positions of the closing pins 830 are so prescribed automatically, or by an operator, as to satisfy both the condition prescribed for the PWB 24 and the condition prescribed for the PWB holding device 800. The horizontal-direction position of each of the holding pins 812 and the closing pins 830 means a position where the axis line of the pin 876 or 836 is positioned on the holding table 810. The pin-storing information includes, for the holding pins 812, the greatest and smallest addresses of the address range in which the holding pins 812 are stored in the holding-pin-storing area 856 and includes, for the closing pins 830, the greatest and smallest addresses of the address range in which the closing pins 830 are stored in the closing-pin-storing area 858.

When the PWB holding device 800 is reset, first, all the holding pins 812 and the closing pins 830 currently set on the holding table 810 are stored in the storing device 850 and, then, appropriate holding pins 812 and closing pins 830 stored in the storing device 850 are set on the holding table 810. The storing and setting of the holding pins 812 or the closing pins 830 are carried out in the same manners as those employed in each of the preceding embodiments. An order in which the holding pins 812 or the closing pins 830 are set is prescribed such that the holding or closing pins 812, 830 stored at the nearer storing positions in the corresponding storing areas 856, 858 to the holding table 810 are earlier taken out, and the pins 812, 830 are earlier set at the remoter setting positions on the holding table 810 from the storing device 850. An order in which the holding pins 812 or the closing pins 830 are stored is reverse to the order in which the holding or closing pins 812, 830 are set, that is, is prescribed such that the holding or closing pins 812, 830 set at the nearer setting positions on the holding table 810 to the storing device 850 are earlier detached, and the pins 812, 830 are earlier stored at the remoter storing positions in the storing areas 856, 858 from the holding table 810. When each holding pin 812 or each closing pin 830 is set or stored, each pin 812, 830 is held by the pin holder 368 and is moved by being slid on the holding surface 826 and the supporting surface 854.

When the pin holder 368 holds each holding pin 812 to store the same 812 in the storing device 850, the X-Y robot 48 moves, according to the setting-position data prescribed for the each pin 812, the pin holder 368 relative to the each pin 812, such that the bracket 438 and others are positioned, relative to the seat member 890 of the each pin 812, on the side of the storing device 850 as seen in the widthwise direction of the seat member 890, and additionally rotates the pin holder 368 to a rotation position at which the direction in which the two grasping fingers 370 are opened and closed is parallel to the lengthwise direction of the seat member 890. Since the seat member 890 of each holding pin 812 has an elongate shape and is attached at a prescribed rotation position to the holding table 810, the pin holder 368 is rotated to correspond to the rotation position of the each pin 812, so that the two grasping fingers 370 can be positioned on opposite sides of the each pin 812, respectively, in a direction parallel to the lengthwise direction of the seat member 890.

From the above-described state, the pin holder 368 is moved toward each holding pin 812, so that the each pin 812 is positioned between the two grasping fingers 370. In this state, the two grasping fingers 370 are closed to grasp the engageable portion 878 of the each pin 812. As shown in FIG. 19, the engageble portion 878 has the four planar engageable surfaces 884, and four recess-defining surfaces 910, in total, defining the respective recesses 446 of the two engageable portions 444 engage the four engageable surfaces 884, respectively, so that the pin holder 368 holds the holding pin 812 such that the pin 812 cannot be rotated relative to the holder 368. The pin holder 368 holding the holding pin 812 is moved while sliding the pin 812 on the holding surface 826, so that the pin 812 is transferred onto the supporting surface 854.

Before the holding pin 812 reaches a prescribed storing position on the supporting surface 854, the pin holder 368 is rotated so that the bracket 438 and others are positioned, relative to the pin 812, on the side of the holding table 810 and the lengthwise direction of the seat member 890 of the pin 812 is parallel to the Y-axis direction. This rotation is effected after the holding pin 812 has been moved to a position which assures that the pin 812 can be rotated while the seat member 890 thereof or the pin holder 368 does not interfere with the other holding pins 812, the closing pins 830, or others. The computer 510 can know whether any free space is present, and what amount of free space is present, on the holding surface 826 or the supporting surface 854, from how the holding pins 812 and the closing pins 830 are stored in the storing device 850 and how the holding pins 812 and the closing pins 830 are set on the holding table 810. Therefore, the pin holder 368 holding the supporting pin 812 is rotated on either of the holding surface 826 and the supporting surface 854 that is currently having a sufficiently large space. Since the engageable portion 878 of each holding pin 812 has the engageable surfaces 884 and the grasping fingers 370 of the pin holder 368 grasp the engageable surfaces 884 of the each pin 812 such that the pin 812 cannot be rotated relative to the pin holder 368, the pin holder 368 can apply, to the pin 812, a great force to rotate the pin 812 about its axis line. Although the seat member 890 of each supporting pin 812 is elongate and holds the two permanent magnets 900 which produce a great magnetic force to attach the each pin 812 to the holding surface 826 or the supporting surface 854, the pin holder 368 can apply, to the each pin 812, a great force to oppose the resistance force when the pin 812 is rotated in the state in which the bottom surface 892 of the pin 812 is closely contacted with the surface 826 or 854. Thus, the pin holder 368 can reliably rotate each holding pin 812 by any desired angle.

Regarding each closing pin 830, the pin holder 368 holds the permanent magnet 838 of the each pin 830, and stores the pin 830 in the same manner as that in which each supporting pin 212 is stored in the first embodiment. In short, the X-Y robot 48 moves the pin holder 368 while the each pin 830 is slid from the holding surface 826 to the portion of the supporting surface 854 that defines the closing-pin storing area 858.

When each holding pin 812 or each closing pin 830 is set, the pin holder 368 is positioned, relative to the pin 81, 830, on the side of the holding table 810 to hold the pin 812, 830, and is moved according to the pin-setting information while the pin 812, 830 is slid from the supporting surface 854 to a prescribed setting position on the holding surface 826, like in each of the preceding embodiments. Thus, in the present embodiment, the supporting-member moving device 48 also functions as a closing-member moving device. In particular, when each holding pin 812 is set, the pin holder 368 is rotated to the rotation position prescribed for the each pin 812, before the pin holder 368 reaches the setting position prescribed for the each pin 812. Thus, the bracket 438 and others are positioned, relative to the each pin 812, on the side of the storing device 850, and the lengthwise direction of the seat portion 890 is made parallel to the prescribed direction. Regarding each closing pin 830, the pin holder 368 is rotated so that the bracket 438 and others are positioned, relative to the each pin 830, on the side of the storing device 850.

In at least one of a first case where the supporting pins 212, 612, 812 set on the first supporting table 210, 620, 810 are stored in the storing device 340, 850, and a second case where the supporting pins 212, 612, 812 stored in the storing device 340, 850 are set on the first supporting table 210, 610, 810, an image of each supporting member 212, 612, 812 may be taken by an image taking device before the each supporting member is grasped by the supporting-member holder 368. In this case, based on image data representing the taken image, an actual position of the supporting member is determined, and the holder is moved to the thus determined position to hold the supporting member. It is possible to take an image of each supporting member just before the each member is grasped, or alternatively take respective images of all the supporting members before each supporting member is grasped. The actual position of each supporting member may be determined, based on the image data, as a position of the center of the support surface 228, 688, 880 of the each supporting member, and the supporting-member holder may be moved to the thus determined actual position. Alternatively, the thus determined actual position may be compared with the prescribed position defined by the pin-setting information or the pin-storing information, to determine a positional error, and the thus determined positional error may be used to modify the amount of movement of the holder so that the holder may be moved to not the prescribed position but the actual position. Anyhow, even if each supporting member may have a positional error, the holder can accurately hold the each supporting member. Regarding each supporting member of such a sort that has a prescribed rotation position, such as each holding pin 812 employed in the embodiment shown in FIGS. 17–21, an actual rotation position of the each supporting member may be determined based on the image data and, if the thus determined rotation position includes an error, this error may be corrected before the each supporting member is stored in the storing device or is set on the first supporting table. The actual rotation position of each supporting member may be a rotation of a fiducial mark provided on the support surface of the each supporting member, e.g., a fiducial line passing through the center of the support surface.

In each of the illustrated embodiments, the transferring unit 360 and others are provided on the Y-axis table 42 and, when the ECs 32 are mounted on the PWB 24, the unit 360 is moved with the suction nozzle 60. However, the transferring unit 360 may be modified such that the unit 360 is moved by the X-Y robot 48 only when the resetting operation is performed, and such that when the ECs 32 are mounted on the PWB 24, the unit 360 waits at a waiting position or shelters to a sheltering position. For example, the transferring unit 360 may be provided on a table different from a table on which the suction nozzle 60, the rotating device 50, the elevating and lowering device 52, and others are mounted, and respective connection portions of the two tables may be connected to, and disconnected from, each other. The two tables may additionally include respective air-supply portions which are for supplying a positive-pressure air to the elevating and lowering device 366 and others. In this case, when the respective connection portions of the two tables are connected to each other, the respective air-supply portions of the two tables are simultaneously connected to each other.

For example, the Y-axis table 42 on which the suction nozzle 60 and others are provided is never detached from the X-axis table 36, and a third table on which the transferring unit 360 is provided is detached from the X-axis table 36 when the ECs 32 are mounted on the PWB 24, so that the third table waits at the waiting position. The waiting position may be a position adjacent, in the Y-axis direction, to the X-axis table 36 being positioned at its origin position. When the X-axis table 36 is returned to the origin position when the resetting operation is performed, the third table on which the transferring unit 360 is provided is connected to the Y-axis table 42 on which the EC mounting head 30 and others are mounted, so that the unit 360 is moved by the X-Y robot 48. After the supporting members are attached to the supporting table, the X-axis table 36 is moved to the origin position, so that the third table on which the unit 360 is provided is disconnected from the Y-axis table 42 on which the head 30 and others are provided, and waits at the waiting position. The Y-axis table 42 having the thus reduced weight is used for the EC mounting operation.

In each of the illustrated embodiments, the resetting operation is performed such that first, all the supporting pins, the holding pins, or the holding and closing pins currently attached to the supporting table or the holding table are detached and then, the supporting pins, etc. needed to hold a new sort of PWB are attached to the table. However, in the case where the respective setting positions and rotation positions of some of the current supporting pins, etc. are common with those of some of the new supporting pins, etc., those common pins may be left on the table. In this case, only the other, current pins are detached from the table, and only the other, new pins are attached to the table.

In each of the illustrated embodiments, the PWB supporting device 174, etc. employs the supporting pins 212 to support the PWB 24, or employs the holding pins 612, etc. to hold and support the PWB 24. However, it is possible to set, on the holding table, both the holding pins each as a supporting member which has the sucking function, and the supporting pins each as a supporting member which does not have the sucking function, so that the holding pins support some portions of the PWB 24 and the supporting pins support the other portions of the PWB 24. In this case, if the negative-pressure-supply holes of the holding table are provided with respective opening and closing valves, it is not needed to employ any closing members. If not, it is possible to employ closing pins to close the respective openings of some negative-pressure-supply holes. In place of, or in addition to, the closing pins, it is possible to use some supporting pins to close some negative-pressure-supply holes. In the last case, those supporting pins function as the closing pins.

In the case where the negative-pressure-supply holes of the holding table are provided with respective opening and closing valves, it is possible to employ holding pins each of which includes an elongate seat portion. In this case, the total number of the negative-pressure-supply holes can be reduced as compared with the case where holding pins each of which includes a seat portion that is not elongate but has a diameter somewhat greater than that of each hole, are employed.

The automatic resetting apparatus 374 may be one which does not share any elements, e.g., the X-Y robot 48, with the EC mounting device 16, i.e., is independent of the EC mounting device 16.

In the third embodiment, the pin 836 of each holding pin 812 including the elongate seat member 890 has the planar engageable surfaces 884, and the grasping fingers 370 grasp those engageable surfaces 884 such that the holding pin 812 cannot be rotated relative to the fingers 370. However, each supporting pin, each holding pin whose seat portion is not elongate, or each closing pin may be one which has planar engageable surfaces in an engageable portion thereof that is grasped by the grasping fingers 370, so that the pin cannot be rotated relative to the fingers 370.

The first supporting table 210, the second supporting table 342, and the holding table 810 may be such that only respective portions thereof that provide the first supporting surface 214, the second supporting surface 344, and the holding surface 826 are formed of a ferromagnetic material.

When the resetting operation is performed, it is possible to use a supporting-table exchanging device which automatically exchanges the first holding tables 210 with each other or the holding tables 610 or 810 with each other. In this case, the supporting tables or the holding tables may be ones which have different sizes corresponding to different sorts of PWBs having different sizes.

In the third embodiment, the pin 836 of each holding pin 812 including the elongate seat member 890 has the planar engageable surfaces 884, and the grasping fingers 370 grasp those engageable surfaces 884 such that the holding pin 812 cannot be rotated relative to the fingers 370. However, each supporting pin, each holding pin whose seat portion is not elongate, or each closing pin may have planar engageable surfaces in an engageable portion thereof that is grasped by the grasping fingers 370, so that each pin cannot be rotated relative to the fingers 370.

The first supporting table 210, the second supporting table 342, and the holding table 810 may be such that only respective portions thereof that provide the first supporting surface 214, the second supporting surface 344, and the holding surface 826 are formed of a ferromagnetic material.

When the resetting operation is performed, it is possible to use a supporting-table exchanging device which automatically exchanges the first holding tables 210 with each other or the holding tables 610 or 810 with each other. In this case, the supporting tables or the holding tables may be ones which have different sizes corresponding to different sorts of PWBs having different sizes.

In each of the illustrated embodiments, the PWB clamping device 172 includes the respective clamping plates which are movably provided on the fixed and movable rails 188, 190, and the respective clamping cylinders which move the respective clamping plates toward the PWB hold-down portions 194 so that the clamping plates cooperate with the hold-down portions 194 to clamp the opposite end portions of the PWB 24. However, the clamping plates may be modified such that when the PWB supporting device is moved upward, the clamping plates are engaged with the first supporting table and, as the first supporting table is moved upward, the clamping plates are moved toward the PWB hold-down portions against the biasing action of the springs, and finally, the clamping plates cooperate with the hold-down portions to clamp the PWB 24.

Otherwise, clamping plates may be provided on the first supporting table. For example, two clamping plates are provided on opposite end portions of the first supporting table, respectively, that extend parallel to the PWB-convey direction, such that the clamping plates extend in the PWB-convey direction and stand upright. Each supporting member should have such a height which assures that the support surface thereof is positioned on the same plane as that on which respective upper end surfaces of the clamping plates are positioned. When the PWB supporting device is moved upward, the supporting members support the PWB 24, the clamping plates support the lower surface 215 of the PWB 24, and cooperate with the PWB hold-down portions 194 to sandwich the opposite end portions of the PWB 24. The distance between the two clamping plates may be changed, by a width changing device, so as to correspond to the width of the PWB 24. In addition, the first supporting table may be one which should have a size corresponding to the current sort of PWB 24s. In this case, in the resetting operation, the current first supporting table is replaced with another first supporting table having a size corresponding to a new sort of PWBs 24, and including two clamping plates the distance of which corresponds to the new sort of PWBs.

In each of the illustrated embodiments, the PWB elevating and lowering device 170 may be one which includes, as its drive source, a pressurized-air-operated cylinder device as a pressurized-fluid-operated actuator.

In each of the illustrated embodiments, the pin holder as the supporting-member holder approaches each supporting pin 212, etc. in a lateral direction, i.e., a direction perpendicular to the axis line of the each pin 212, and holds the same 212. However, the supporting-member holder may be one which approaches each supporting member, each holding member, or each closing member in a direction parallel to the axis line of each member, i.e., a downward direction, and holds the each member.

In each of the illustrated embodiments, the two guide rails 188, 190 may be modified such that the distance between the two guide rails may be manually changed by the operator.

While the present invention has been described in its preferred embodiments, it is to be understood that the present invention is not limited to the details of those embodiments but may be embodied with other changes and improvements, such as those described in SUMMARY OF THE INVENTION, that may occur to a person skilled in the art without departing from the spirit and scope of the invention defined in the appended claims.

What is claimed is:

1. A system for performing an operation relating a printed wiring board, comprising:

a first supporting table which has a planar first supporting surface, at least a portion of the first supporting table that defines the first supporting surface being formed of a ferromagnetic material;

a plurality of supporting members each of which has a seat portion having a bottom surface which is seated on the first supporting surface, and a support surface which is opposite to the bottom surface, at least a portion of the seat portion being formed of a permanent magnet, said each supporting member being attached, owing to a magnetic force of the permanent magnet, to the first supporting surface to support a back surface of the printed wiring board;

an operation performing device which performs an operation for a front surface of the printed wiring board whose back surface is supported by the respective support surfaces of the supporting members;

a second supporting table which is provided in a vicinity of the first supporting table and has a second supporting surface which is substantially continuous with the first supporting surface on a common plane, at least a portion of the second supporting table that defines the second supporting surface being formed of a ferromagnetic material; and a supporting-member moving device which moves said each supporting member from the second supporting surface to the first supporting surface, and from the first supporting surface to the second supporting surface, by sliding said each supporting member on the first and second supporting surfaces.

2. A system according to claim 1, further comprising a printed-wiring-board conveying device which carries in the printed wiring board to a position aligned with the first supporting table, and carries out the printed wiring board from said position.

3. A system according to claim 2, wherein the printed-wiring-board conveying device comprises:

two guide rails whose distance is changeable;

a printed-wiring-board moving device which moves the printed wiring board along the guide rails; and a width changing device which changes the distance of the two guide rails and thereby changes a width of conveying of the printed wiring board.

4. A system according to claim 3, wherein the second supporting table is provided at a position aligned with a space remaining between the two guide rails when the distance of the two guide rails is shortest, and wherein the second supporting surface has a width not longer than the shortest distance.

5. A system according to claim 1, wherein the first holding table comprises a holding table having a holding surface as the first supporting surface, and a plurality of negative-pressure-supply holes opening in the holding surface, and wherein the supporting members comprise a plurality of holding members each of which has a negative-pressure passage formed therethrough, and is set on the holding surface of the holding table such that the negative-pressure passage thereof is communicated with at least one of the negative-pressure-supply holes, so that the support surface of said each holding member supports the back surface of the printed wiring board and a negative pressure supplied via the negative-pressure passage from said at least one negative-pressure-supply hole is applied to the back surface of the board to hold the board.

6. A system according to claim 5, further comprising:

a plurality of closing members each of which has a bottom surface which is seated on the holding surface of the holding table, at least a portion of said each closing member that is located in a vicinity of the bottom surface being formed of a permanent magnet, said each closing member being attached, owing to a magnetic force of the permanent magnet, to the holding surface to close one of the negative-pressure-supply holes that is not communicated with the negative-pressure passages of any holding members;

a third supporting table which is provided in a vicinity of the holding table and has a third supporting surface which is substantially continuous with the holding surface on the common plane, at least a portion of the third supporting table that defines the third supporting surface being formed of a ferromagnetic material; and a closing-member moving device which moves said each closing member from the third supporting surface to the holding surface and from the holding surface to the third supporting surface, by sliding said each closing member on the third supporting surface and the holding surface.

7. A system according to claim 6, wherein the third supporting table is provided by the second supporting table, and the closing members are supported on the second supporting surface.

8. A system according to claim 6, wherein the closing-member moving device is provided by the supporting-member moving device.

9. A system according to claim 1, wherein the operation performing device comprises an operation performing head, and wherein the supporting-member moving device moves the operation performing head in a direction parallel to the first supporting surface.

10. A system according to claim 1, wherein the supporting-member moving device comprises at least one engageable portion which is engageable with a portion of said each supporting member that is near to the bottom surface thereof.

11. A system according to claim 1, wherein the supporting-member moving device comprises a pair of grasping members which are engageable with said each supporting member.

12. A system according to claim 1, wherein the supporting-member moving device comprises a holding device which holds said each supporting member; and a rotating device which rotates said each supporting member held by the holding device.

* * * * *